United States Patent [19]

Piurek

[11] Patent Number: 4,534,502
[45] Date of Patent: Aug. 13, 1985

[54] AUTOMATIC SOLDER MACHINE

[75] Inventor: Walter J. Piurek, Oxnard, Calif.

[73] Assignee: Atlantic Richfield Company, Los Angeles, Calif.

[21] Appl. No.: 466,388

[22] Filed: Feb. 14, 1983

[51] Int. Cl.$^3$ .............................................. H01L 35/34
[52] U.S. Cl. ...................................... 228/102; 228/47; 228/179; 228/6.2; 29/572; 136/244
[58] Field of Search ................. 228/47, 4.1, 6 R, 6 A, 228/5.1, 179; 29/572; 136/244, 256

[56] References Cited

U.S. PATENT DOCUMENTS 4,173,820 11/1979 Mueller et al. .................... 29/572
4,430,519 2/1984 Young .............................. 29/572 X

OTHER PUBLICATIONS

Bycer, "Automated Solar Module Assembly Line; Final Report", Dept. of Energy Pub. DOE/JPL/9552-87-80/6, Aug. 1980.
Somberg, "Automated Solar Panel Assembly Line; Final Report", Dept. of Energy Pub. DOE/JPL-9552-78-81, May 1981.

Primary Examiner—Kenneth J. Ramsey
Attorney, Agent, or Firm—Nilsson, Robbins, Dalgarn, Berliner & Wurst

[57] ABSTRACT

Apparatus and method for applying at least one elongated conductor to a plurality of solar cells to establish electrical connection between the cells involves conveying the cells past a preselected location and feeding at least one elongated conductor between each cell and the succeeding cell as the cells move. In a preferred embodiment the cells are conveyed to the preselected location at a first rate of speed and in a first spaced apart condition, and are conveyed from the location at a second reduced rate of speed and in a second more closely spaced condition. The feeding operation can be synchronized with the conveyor by generating an analog signal which represents the position of a cell along the conveyor and controlling the feeding in response to the analog signal.

22 Claims, 35 Drawing Figures

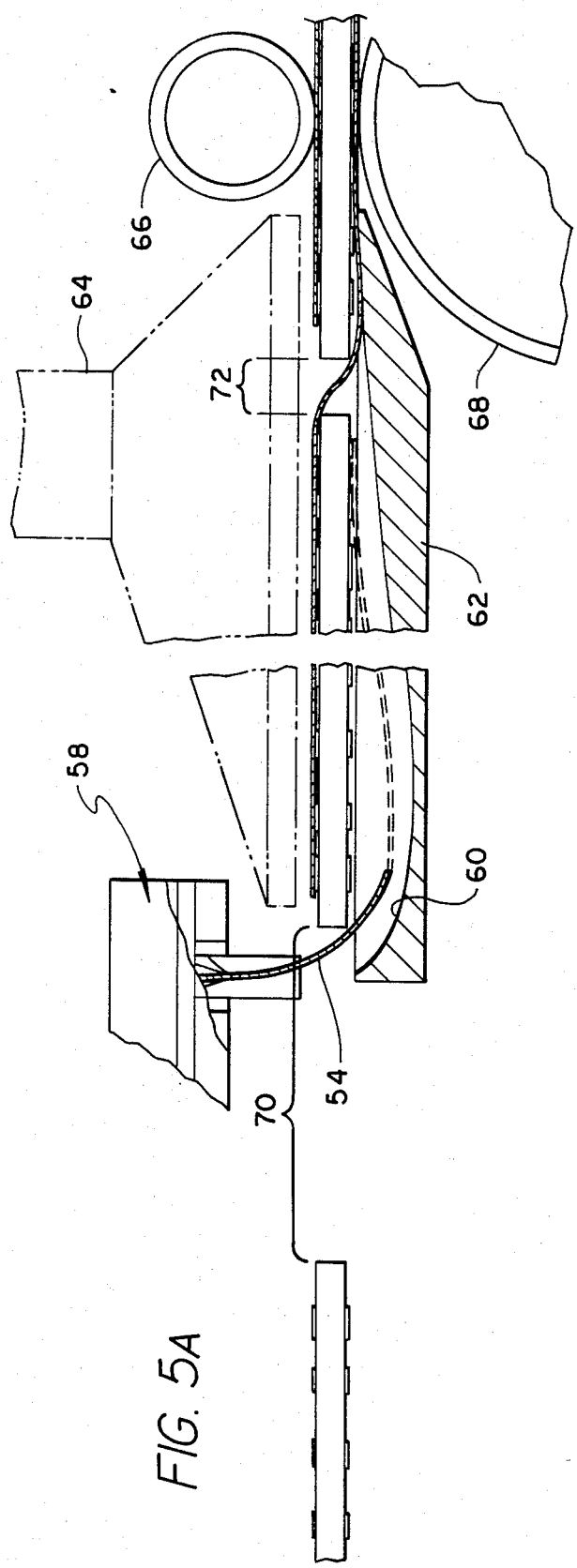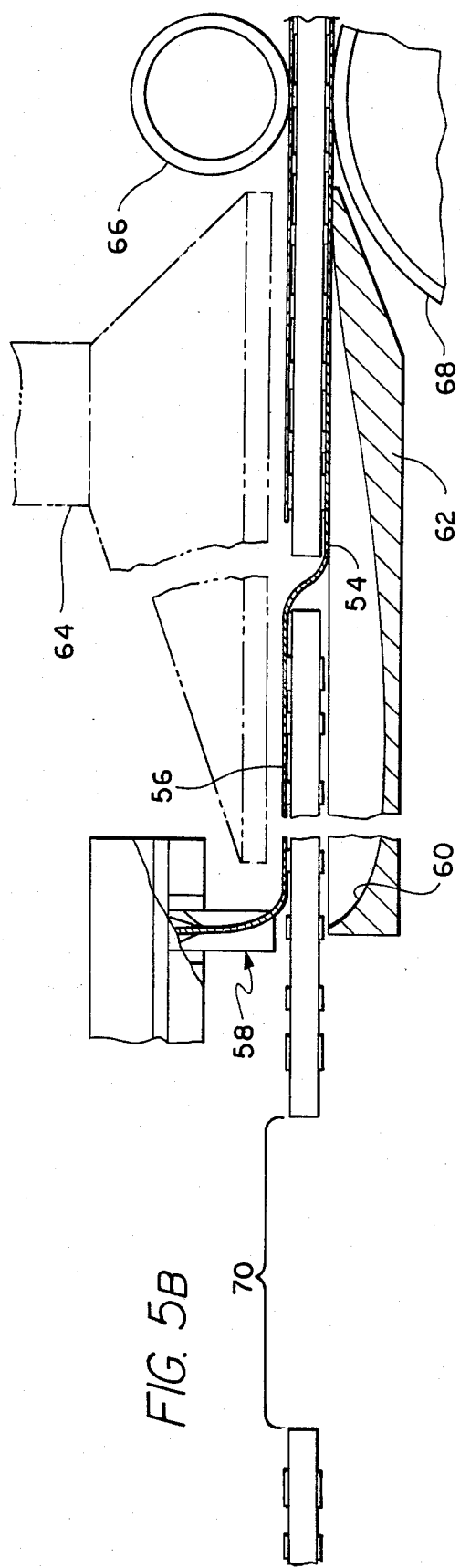

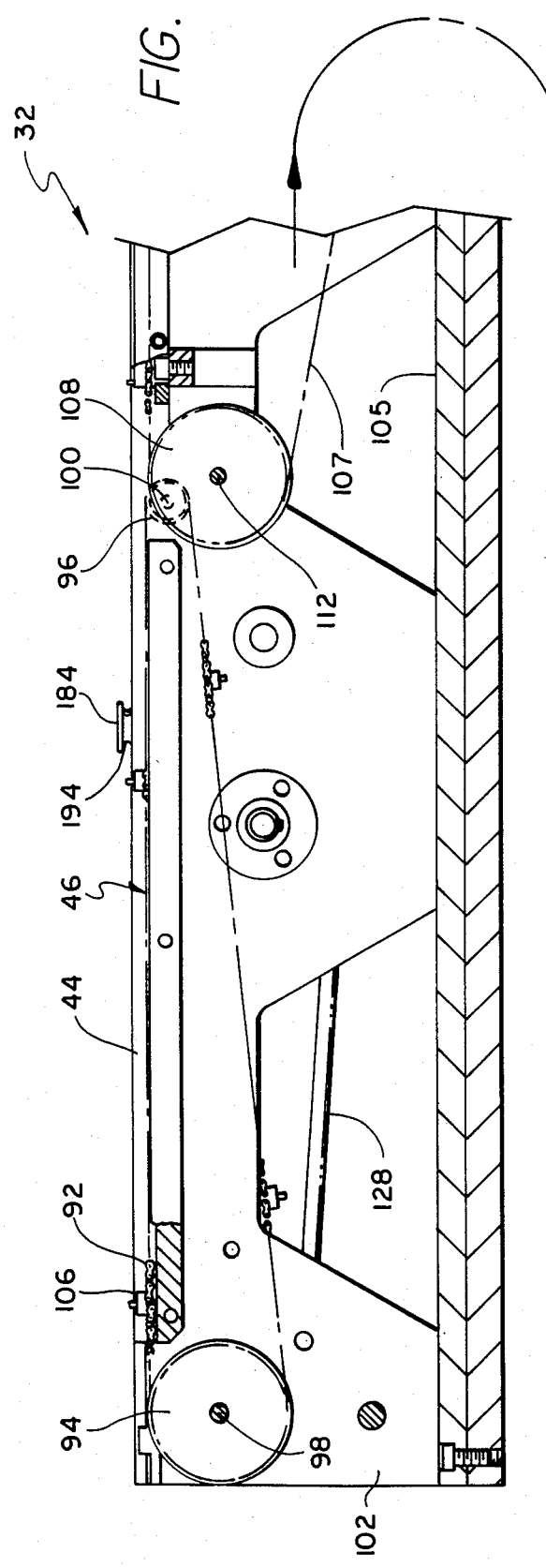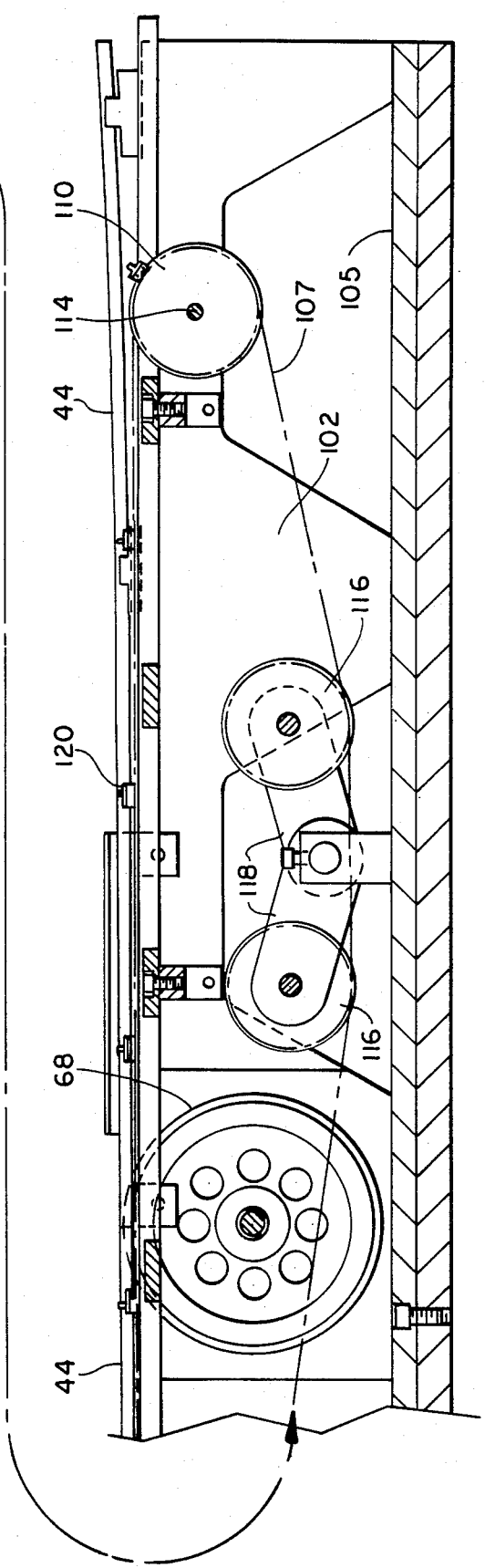
FIG. 6

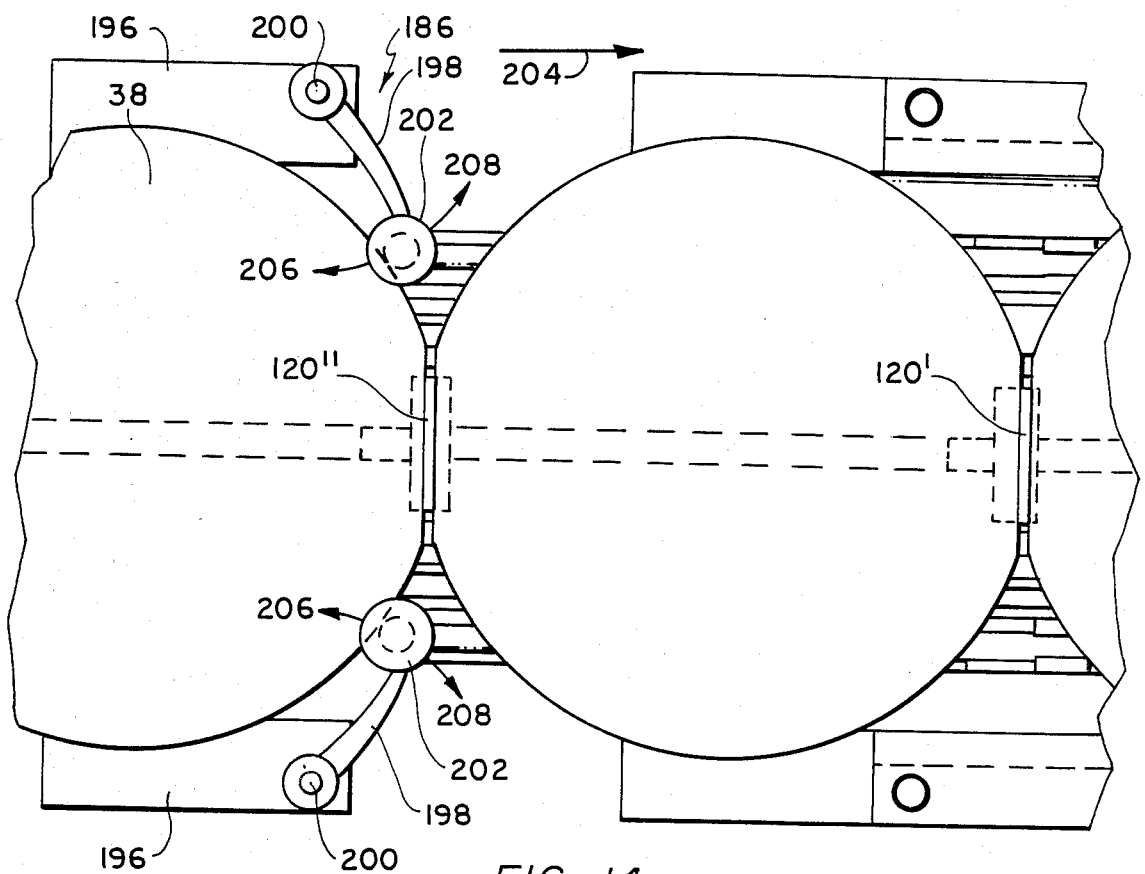
FIG. 14
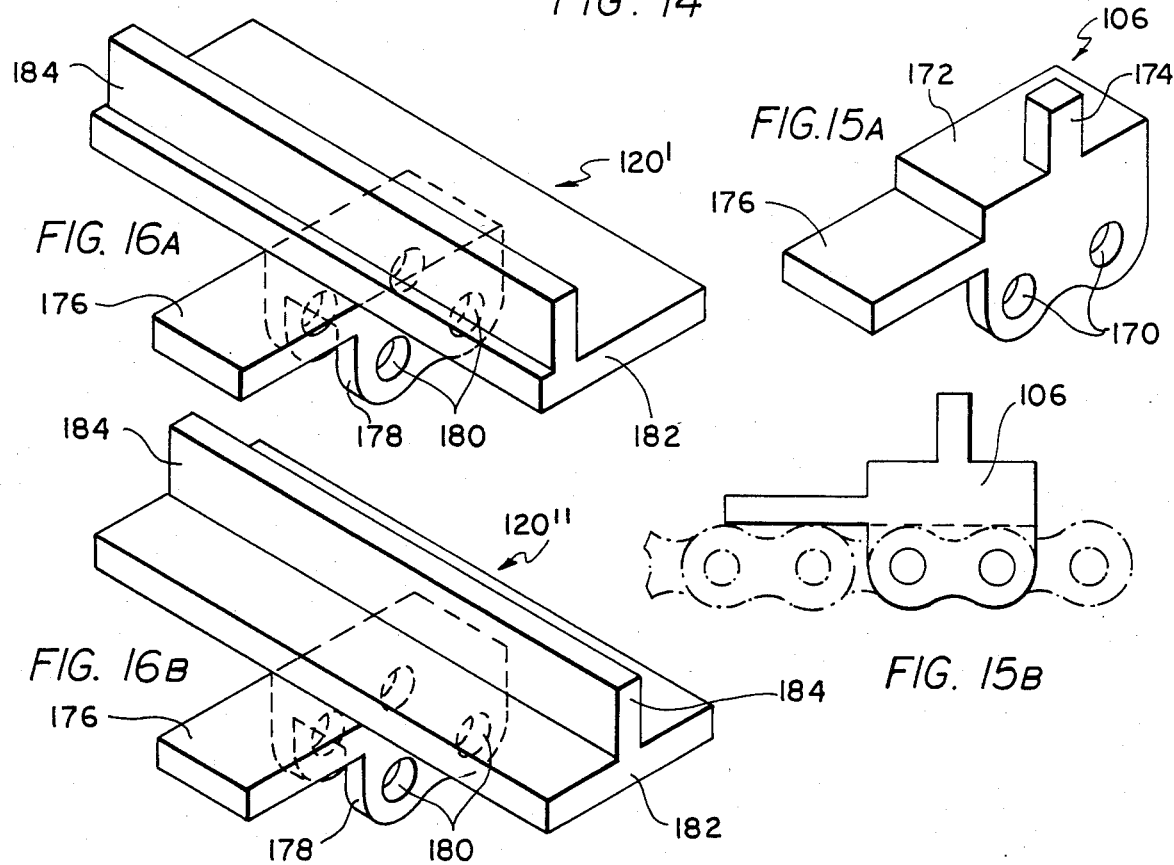
FIG. 16A
FIG. 15A
FIG. 16B
FIG. 15B 4,534,502

AUTOMATIC SOLDER MACHINE

BACKGROUND OF THE INVENTION

This invention relates generally to the soldering art and, more particularly, to an apparatus for soldering at least one elongated conductor to a plurality of solar cells to establish electrical connection between the cells.

In recent years, substantial effort has been expended to develop automated equipment for the assembly of solar panels. In the course of these efforts, it has proved difficult to design a machine capable of rapidly and accurately interconnecting individual solar cells into a string. For example, a solar panel soldering apparatus is described in Bycer, "Automated Solar Module Assembly Line: Final Report", Department of Energy Publication No. DOE/JPL/ 955287-80/6, August 1980. The Bycer apparatus involves a "walking beam conveyer" for moving and indexing solar cells through various stations before they are transferred to a conveyor belt for final soldering. The walking beam conveyor individually picks up cells from one station and swings forward to advance them to the next station for performance of a subsequent operation. After advancement, a cell is held at the new station by vacuum and the conveyor mechanism retracts to its initial position. The indexing system is controlled by a microprocessor and serves to advance the cells through a number of stations, including a flux application station and a first soldering station at which a pair of short conductive tabs are connected to the upper surface of each cell. Upon reaching the conveyor belt, each cell is inverted and positioned for connection with a string of preceding cells. The cell is connected to the string from above by soldering the tabs to the opposite surface of the preceding cell. The string of soldered cells then progresses intermittently along the conveyor belt through at least one additional station. The cells are supported on the conveyor belt by tapered support wheels arranged in groups of four to engage the cells at isolated points thereabout. The soldering operations are performed by induction heating or pulsed heating.

Another soldering apparatus is disclosed in Somberg, "Automated Solar Panel Assembly Line: Final Report", Department of Energy Publication No. DOE/JPL-955278-81, May 1981. In the Somberg machine, cells are connected in series by segments of copper ribbon driven downwardly between two adjacent cells and forwardly under the first of the cells, causing a leading end of each segment to contact the underside of the first cell. The trailing end of the segment is then allowed to fall over and contact the opposite side of the succeeding cell. To accomplish this, ribbon from a storage reel is first driven at a rapid rate and then advanced more slowly over the top of the succeeding cell, whereupon it is sheared to produce a discrete ribbon segment. The segment is soldered to the cells in this configuration by a heat lamp and a pair of pincher rollers downstream of the ribbon feed location.

In the Somberg apparatus, a complex ram mechanism pushes each cell intermittently through a number of different process stations and finally onto a conveyor belt for transport to a soldering station. The ram advances each cell from a handling cassette to a "standby" position, and from the standby position to a "ribbon feed" position at which the conductive ribbon is fed behind and beneath the cell. The cell is then picked up by the conveyor belt, allowing the trailing end of the ribbon to fall on the succeeding cell.

The functions of the Somberg apparatus are implemented sequentially by proximity sensors which produce discrete control signals in response to a metallic coating at the edges of the cells. The pincher rollers are driven at the speed of the conveyor belt and each cell is held by a plurality of spring loaded arms which snap inwardly to captivate the cell.

As seen from the above discussion, the machines of Bycer and Somberg are rather complex and difficult to control. The walking beam conveyor of Bycer has a large number of moving parts which must operate with great precision to maintain cell alignment. The conveyor inverts the cells at a crucial point between soldering operations and intermittently moves them down the assembly line. Such movement can be highly disruptive of cell alignment. The Somberg machine is also complex and has inherent problems of cell alignment, ribbon feed and machine timing. For example, the ram mechanism and the snap-in arms tend to torque the cells from their intended positions, the ribbon feed mechanism can jam, and the proximity sensors used for timing are unreliable.

Therefore, in many applications it is desirable to provide a relatively simple and inexpensive apparatus for connecting solar cells in series by at least one conductive element.

SUMMARY OF THE INVENTION

The present invention comprises an apparatus and method for applying at least one elongated conductor to a plurality of solar cells having first and second oppositely directed surface portions, to establish electrical connection between the cells. In a preferred embodiment, the method comprises conveying the cells to a preselected location at a first rate of speed and in a first spaced apart condition; conveying the cells from the preselected location at a second rate of speed to cause them to assume a second more closely spaced condition; and feeding at least one elongated conductor between each cell and a succeeding cell as they are conveyed past the preselected location, such that the conductor extends from the first surface portion of the cell to the second surface portion of the succeeding cell. In another embodiment, the method comprises: conveying the cells past a preselected location; feeding at least one elongated conductor between each cell and the succeeding cell as they are conveyed past the preselected location; and synchronizing the feeding operation with the conveying operation by generating an analog signal representing the position of a cell as it is conveyed and controlling the feeding operation in response to the analog signal. The conductors may be soldered to the solar cells at a second location downstream of the preselected location by heating the cells and the conductors and pressing them together in a soldering relationship. The heating and pressing operations are then also synchronized by the analog signal. The analog signal may be generated by a potentiometer having a rotatable contact which is coupled for rotation as the cells are conveyed.

The apparatus and method of the present invention operate simply and reliably to solder solar cells together in a preselected orientation. The dual conveyor transports the cells continuously along an assembly line and automatically reduces the spacing between cells at a preselected ribbon feed location. The spacing is considerable in the early part of the ribbon feed operation so that ribbon can be driven between adjacent cells and beneath one of the cells as the cells move. Ribbon is driven between the cells in the time it takes to close up the cells from the first spaced apart condition to the second more closely spaced condition. The cells are closed up by continuing to transport the succeeding cell at the initial rate of speed after the preceding cell has been slowed to the second rate of speed. Thus, the cells are transported to and from the ribbon feed location in a smooth and carefully controlled manner and without hazard to the cells. This arrangement is much more reliable than those of the prior art machines. In addition, pusher elements of the present invention aid in aligning the cells and in maintaining cell alignment throughout the conveying process. This is accomplished by pushing the cells on flat portions thereof and guiding the cells to the desired orientation without confining them.

The timing scheme of the present invention is also simpler and more reliable than that of the Somberg apparatus. Rather than using proximity sensors to detect a metallic coating on a cell, the apparatus of the present invention has a potentiometer driven by the conveyor mechanism to generate a continuously varying analog signal for timing purposes. The analog signal is a ramp voltage which repeats itself each time one of the conveyors travels through a distance corresponding to its center-to-center cell spacing. Comparison of the ramp voltage with a preselected reference voltage permits the apparatus to be accurately synchronized relative to the cells.

Rotation of a pair of pincher rollers at the solder location may be controlled relative to the speed of the main conveyor by a variable speed power transmission. The transmission is preferably adjusted to draw the cells slightly away from the pusher elements as they pass through the rollers, preventing the cells from being compressed between the pusher elements and the rollers. Any misalignment of cells which might otherwise result from compressive forces is thus eliminated. Alignment is crucial in the soldering of solar cells because the conductive ribbons and the contact portions of the cells are made very small to minimize the amount of cell area which is blocked from sunlight. If the conductors are not aligned with the contact pads, the cells can be inoperative due to inadequate electrical connection.

The ribbon feed mechanism of the present invention is also improved over that disclosed by Somberg. A ribbon guide associated with the ribbon feed mechanism has been modified to minimize jamming, and a service loop has been provided for supplying conductive ribbon from bulk reels. Ribbon is provided to a pair of ribbon drive reels at a substantially constant tension, without stretching or tangling.

BRIEF DESCRIPTION OF THE DRAWINGS

The above and other objects of the present invention may be more fully understood from the following detailed description, taken together with the accompanying drawings, wherein similar reference characters refer to similar elements throughout and in which:

FIG. 5A is an enlarged schematic representation of a portion of the solder machine of FIG. 1 adjacent to the ribbon feed location thereof, illustrating the initial phase of the ribbon feed process;

FIG. 5B is an enlarged schematic representation similar to FIG. 5A, illustrating the second phase of the ribbon feed operation;

FIG. 6 is an enlarged vertical sectional view taken along the line 6—6 of FIG. 2;

FIG. 14 is an enlarged top plan view of the solder machine of FIG. 2 in the area of the solder rollers, with the upper assembly removed and the solar cells exposed;

FIG. 15A is an enlarged perspective view of a cell pusher link of the mini-conveyor chain of the machine illustrated in FIG. 2;

FIG. 15B is an enlarged elevational view of the pusher link of FIG. 15A, with other portions of the mini-conveyor chain shown in phantom;

FIGS. 16A and 16B are enlarged perspective views of two possible configurations of cell pusher links of the main conveyor chain used in the machine of FIG. 2;

DESCRIPTION OF THE PREFERRED EMBODIMENTS

Figure 1:
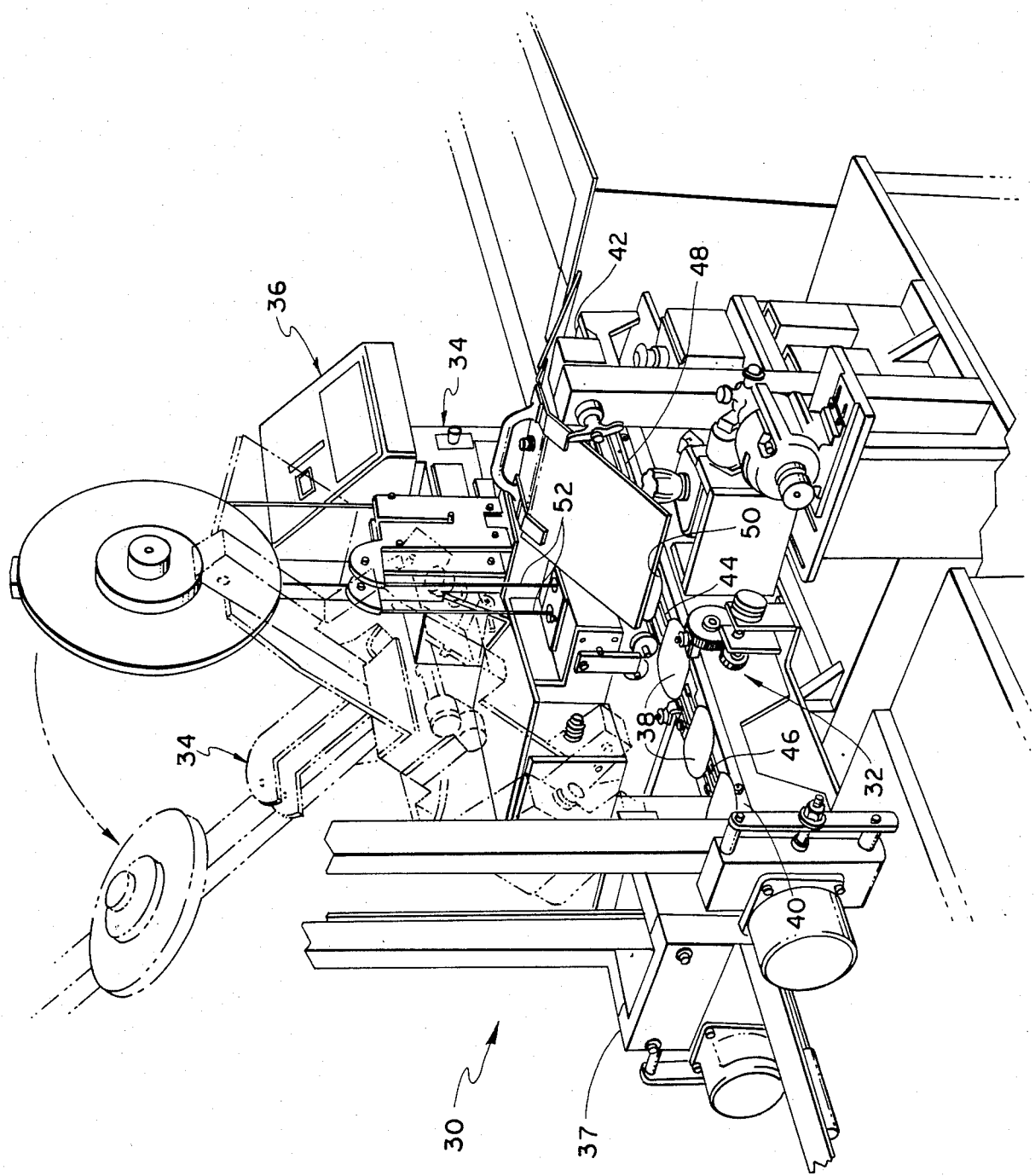
FIG. 1 is a generalized perspective view of an automatic solder machine constructed according to the present invention.
Figure 2:
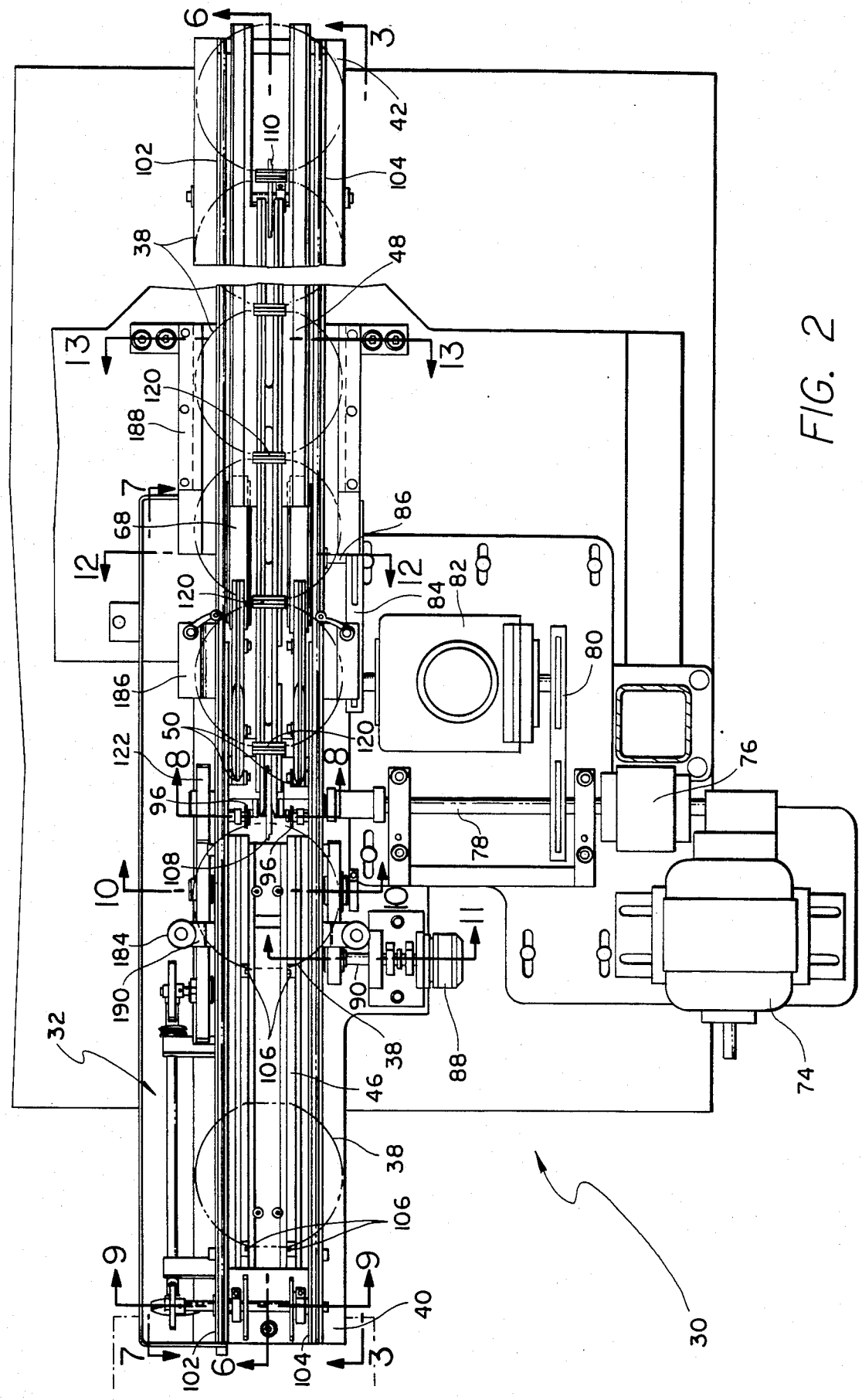
FIG. 2 is a top plan view of the solder machine of FIG. 1 with an upper assembly removed.
Figure 3:
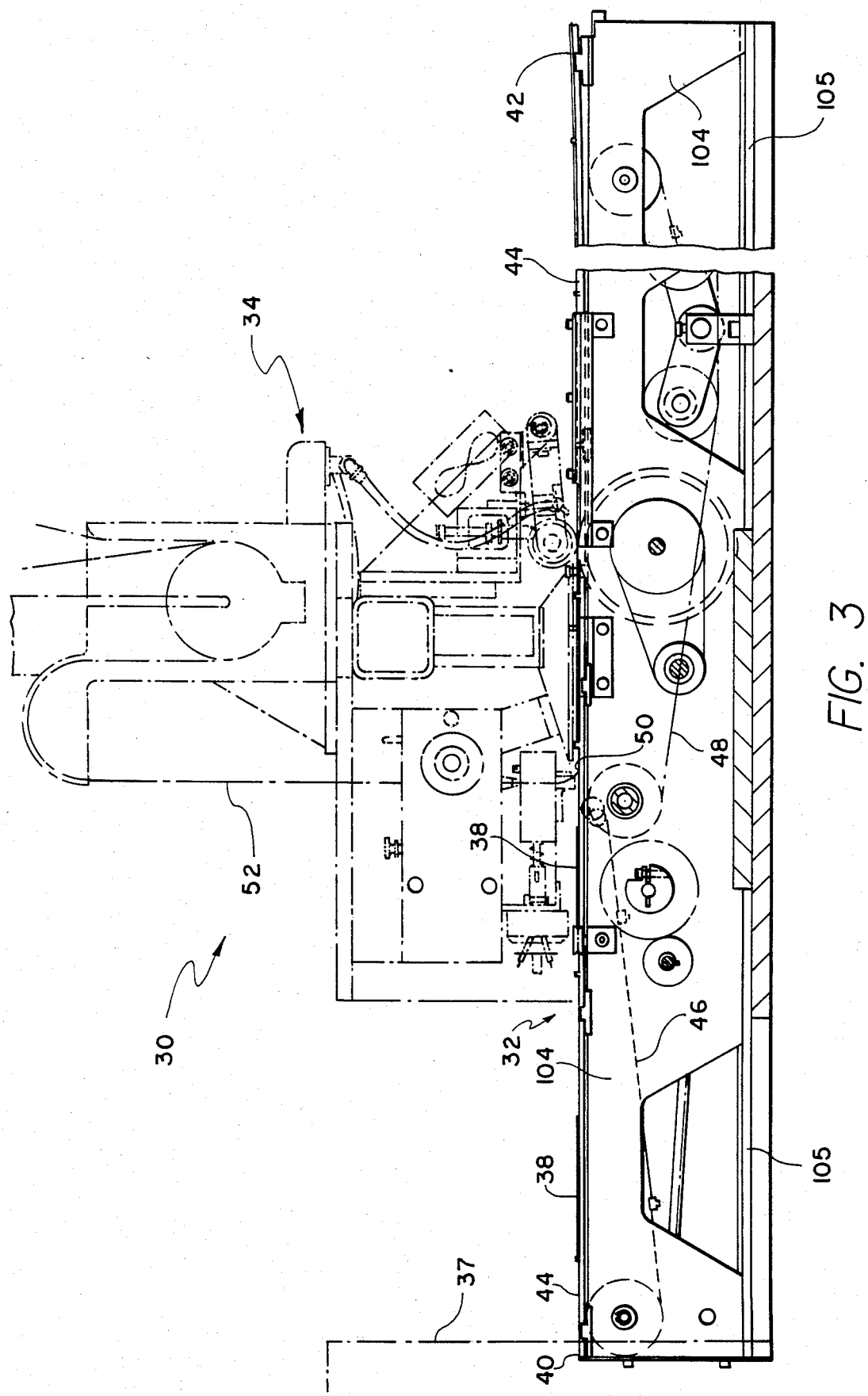
FIG. 3 is a vertical sectional view taken along the line 3—3 of FIG. 2, showing the upper assembly in phantom.

Referring now to FIGS. 1, 2 and 3, an automatic solder machine 30 constructed according to a preferred embodiment of the present invention comprises a conveyor assembly 32, an upper assembly 34, a control assembly 36 and a cell loader 37. The conveyor assembly 32 transports a plurality of solar cells 38 from a front end 40 to a rear end 42 thereof. The solar cells are pushed along parallel low-friction rails 44 by pusher elements of a first or "mini" conveyor 46 and a second or "main" conveyor 48. The mini-conveyor 46 transports the cells at a first rate of speed from the front end 40 of the conveyor assembly to a ribbon feed location 50 thereof, where the cells are picked up by the pusher elements of the main conveyor and transported at a second reduced rate of speed to the rear end 42. The reduced speed of the main conveyor causes the cells to be more closely spaced on the main conveyor than on the mini-conveyor. Thus, as the cells are brought toward the ribbon feed location 50, they close in on the slower moving cells of the main conveyor. The ribbon feed location is just beyond the point at which each cell is first picked up by the main conveyor, permitting a pair of conductive ribbons 52 to be fed downwardly between two spaced apart cells by the upper assembly 34. The ribbons are initially fed at a rapid rate and directed forwardly under a cell which has just passed the ribbon feed location, until the leading edges of the ribbons reach the forwardmost solder pad on the underside of that cell. The ribbon speed is then slowed to a rate which is equal to the speed of the main conveyor 48, allowing the ribbons to fall on the upper surface of the succeeding solar cell. By this time, the spacing between the cells has been reduced to substantially the spacing of cells on the main conveyor. The ribbons are then sheared, producing a pair of discrete ribbon segments. When the succeeding cell passes the ribbon feed location 50, the conductive ribbons are fed downwardly beneath it in the same manner.

A short distance beyond the ribbon feed location, the cells and the conductive ribbon segments are heated and passed through compressive rollers of the conveyor assembly 32 and the upper assembly 34, respectively, causing the ribbon segments to be soldered to a plurality of solder pads of the cells. Either the ribbon segments or the contact pads, or both, may be pre-coated with solder for this purpose.

Figure 4A:
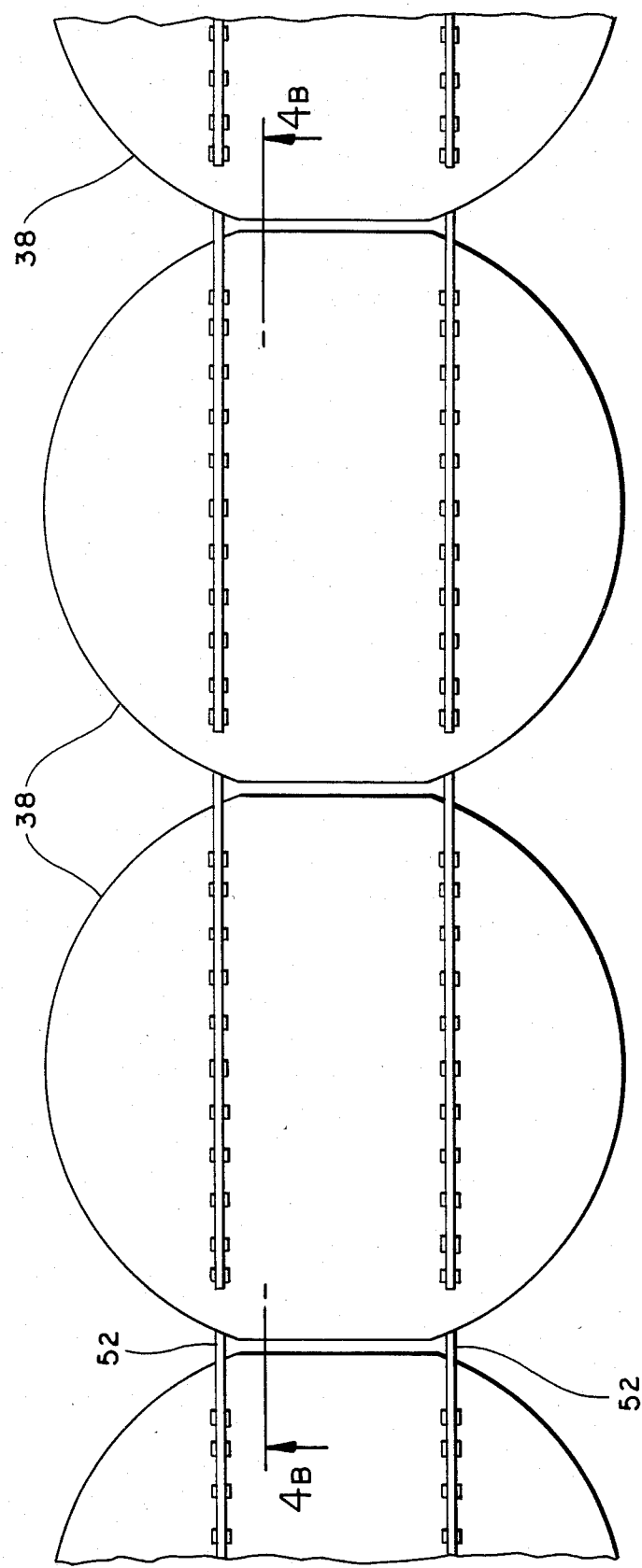
FIG. 4A is a top plan view of a string of solar cells connected by parallel conductive ribbons, as accomplished by the automatic solder machine of FIG. 1.
Figure 4B:
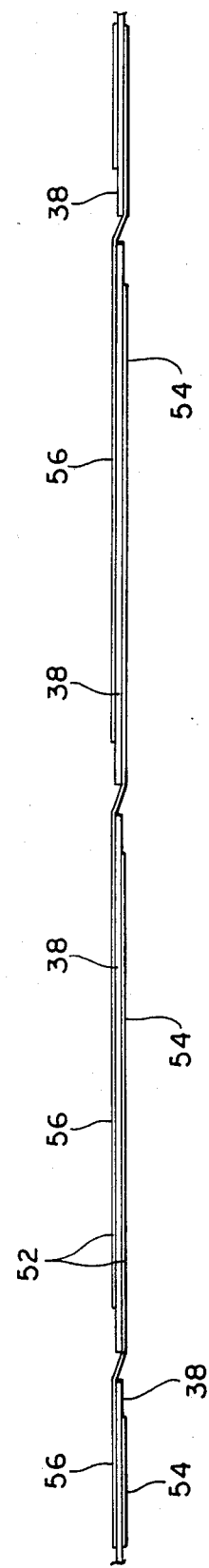
FIG. 4B is a vertical sectional view taken along the line 4B—4B of FIG. 4A.

The solar cells reaching the rear end 42 of the conveyor assembly are thus connected in series by parallel conductive ribbon segments, as illustrated in FIGS. 4A and 4B. The ribbon segments extend from leading portions 54 at the underside of one cell to trailing portions 56 at the upper side of the succeeding cell.

The relationship between the ribbon feed operation and cell transport can be seen most clearly in FIGS. 5A and 5B. FIG. 5A illustrates the first phase of the ribbon feed operation, wherein the leading portion 54 of each of the conductive ribbons is forced downwardly between two cells immediately after one of the cells passes the ribbon feed location. The ribbon exits a lower ribbon guide 58 of the upper assembly and is deflected forwardly under the cell by an arcuate surface 60 of a ribbon guide trough 62. The ribbon is advanced at a rate approximately 10 times the speed of the associated cell until the leading portion 54 assumes the broken line condition of FIG. 5A and extends to the last solder pad at the end of the cell. The ribbon is then slowed from the initial rapid feed rate to a rate equal to the speed of the main conveyor, allowing the trailing portion 56 to fall over the top of the succeeding cell. In the meantime, both the cell and the ribbon are heated by a heat lamp 64 and are soldered together when compressed between rollers 66 and 68. The rollers are positioned to begin soldering the leading portions of the ribbons to one cell as the trailing portions are fed over the top of the succeeding cell. The ribbons are thus held in position relative to the cells throughout the ribbon feed and soldering operations.

With regard to FIGS. 5A and 5B, it will be appreciated that the speed differential between the mini-conveyor and the main conveyor permits the cells to be much more widely spaced during the ribbon feed operation and yet be connected into a final closely spaced series on the main conveyor. The cells are spaced by a substantial distance 70 when ribbon feed is initiated, permitting the rapid phase of ribbon feed to be accomplished without mishap or interference by the succeeding cell. During the ribbon feed operation, the spacing is reduced from the distance 70 to a relatively small distance 72.

As seen most clearly in FIG. 2, the conveyors 46 and 48 are geared together and driven by a motor 74 acting through a slip coupling 76 and a drive shaft 78. The solder rollers are also driven by the motor 74, through a first chain drive 80, an adjustable ratio mechanism 82 and a second chain drive 84. The chain drive 84 acts through a shaft 86 to drive the lower solder rollers 68. The adjustable ratio mechanism permits the solder rollers 68 to be driven at a circumferential speed slightly greater than the speed of the main conveyor, causing the cells to be pulled slightly away from the pushers of the conveyor during the soldering process. This prevents the cells from being compressed between the pusher elements and the solder rollers.

A control signal for synchronizing the various functions of the machine 30 is provided by a servo potentiometer 88 coupled to the mini-conveyor through a shaft 90. The potentiometer is preferably a rotatable linear potentiometer which generates a ramp or "sawtooth" output that is repeated each time the mini-conveyor moves through a distance equal to the center-to-center spacing of cells. This output is used to produce a main timing signal, as described below in relation to the control assembly 36.

The conveyor assembly 32 is shown in detail in FIGS. 6 through 13, wherein the mini-conveyor 46 comprises a pair of chains 92 extending between forward drive sprockets 94 and rear idler sprockets 96 (FIG. 6). The sprockets 94 are carried on a shaft 98 which extends between the side plates 102 and 104 of the conveyor assembly, and the sprockets 96 rotate about the shanks of respective machine bolts 100 carried by the side plates. The side plates 102 and 104, and a base 105 supporting them, make up the structural foundation of the conveyer assembly. The shafts 98 and 100 are perpendicular to the side plates and are mounted for rotation relative thereto, providing parallel axes of rotation for the respective sprockets. The chains 92 have a plurality of pusher elements 106 spaced equally thereabout to push the solar cells along the rails 44. The main conveyor 48 comprises a single chain 107 extending between a drive sprocket 108 and a rear idler sprocket 110 (FIG. 6). The sprockets 108 and 110 are mounted for rotation perpendicular to the side plates by a pair of shafts 112 and 114. They are keyed to the shafts and located midway between the side plates. A pair of weighted tensioner sprockets 116 engage the chain at the lower portion thereof to take up any slack in the chain. The tensioner sprockets are mounted for rotation on pivoting arms 118 to act against the chain under the influence of gravity. A plurality of pusher elements 120 are mounted at equal intervals along the chain to push the cells along the rails 44. The miniconveyor engages laterally spaced areas at the rear of each cell and the main conveyor engages the cells between those areas. This permits the conveyors to overlap slightly without interfering with one another, providing a smooth transition from one conveyor to the next.

Figure 7:
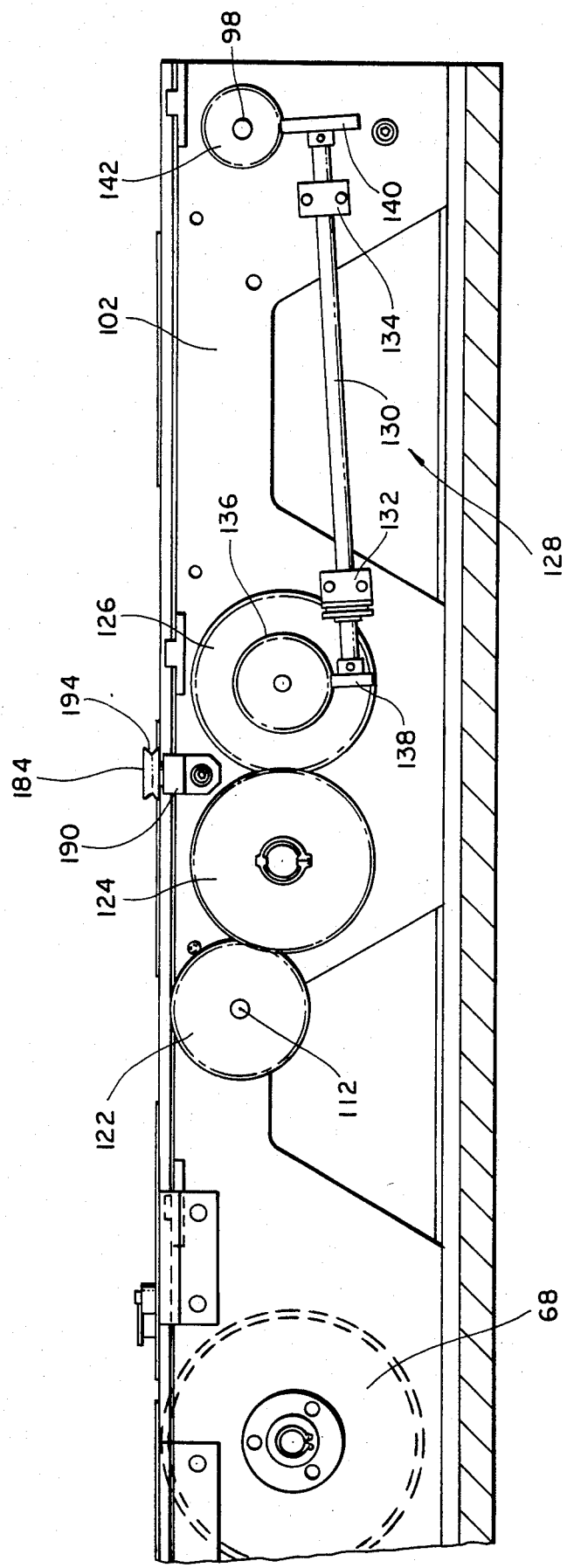
FIG. 7 is an enlarged fragmentary vertical sectional view taken along the line 7—7 of FIG. 2.
Figure 9:
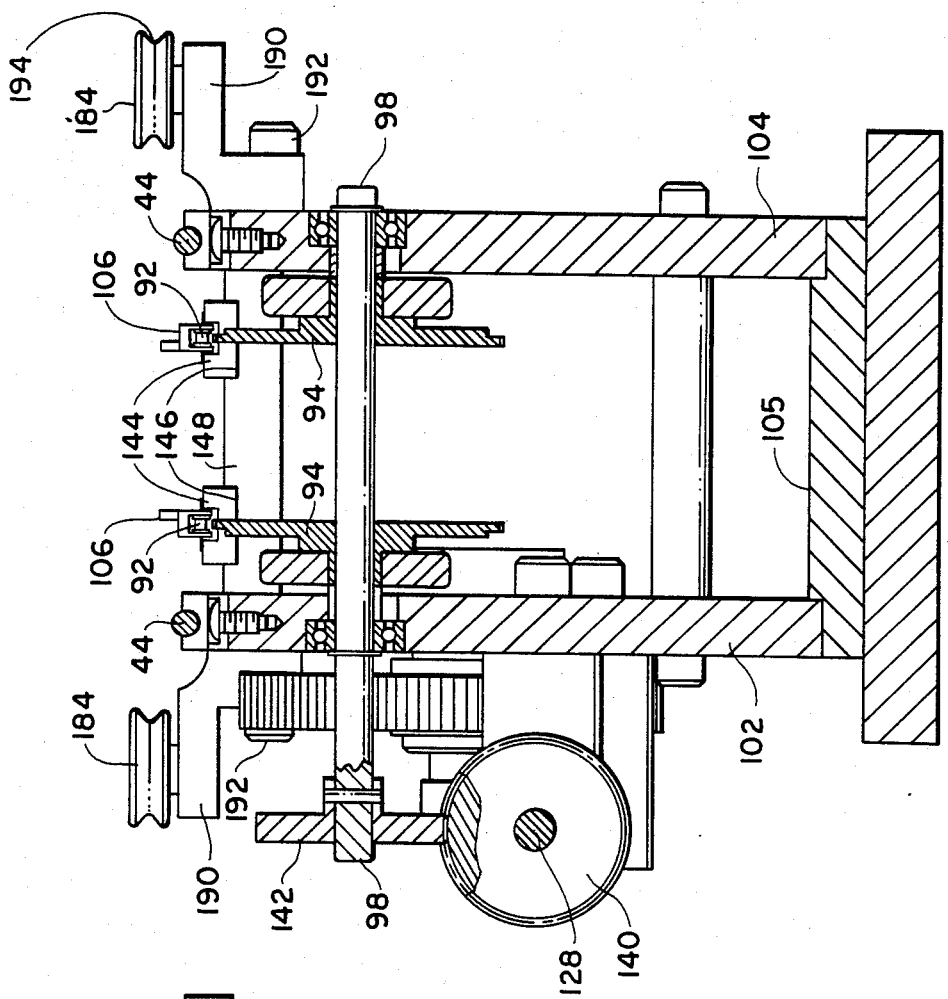
FIG. 9 is an enlarged vertical cross-sectional view taken along the line 9—9 of FIG. 2.
Figure 8:
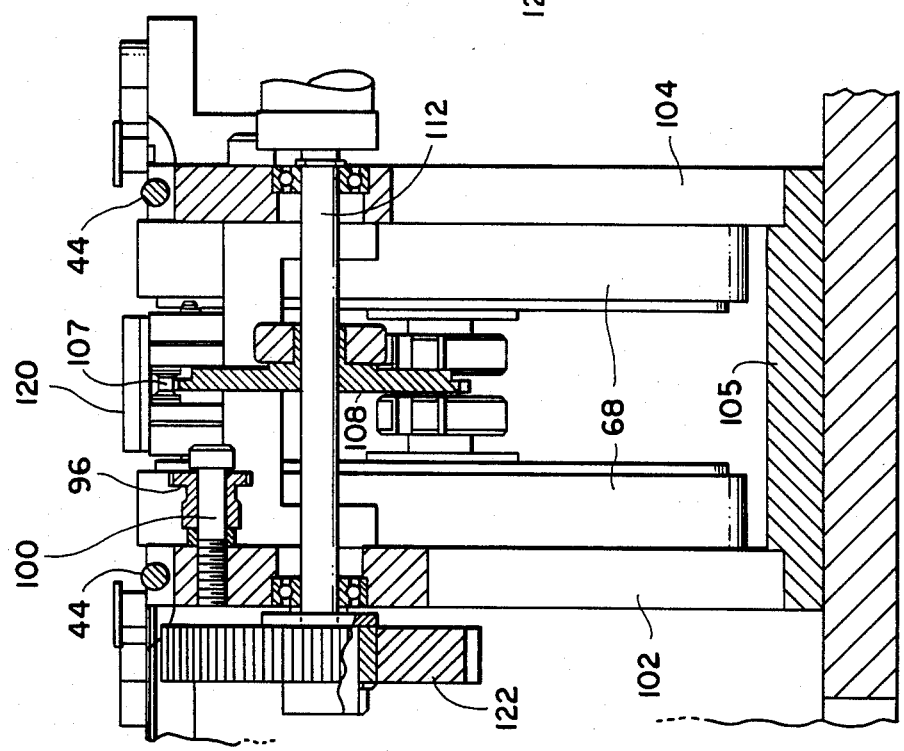
FIG. 8 is an enlarged fragmentary vertical cross-sectional view taken along the line 8—8 of FIG. 2.

The mechanism for driving the two conveyors is seen most clearly in FIGS. 7, 8 and 9. Referring first to FIG. 8, the shaft 112 and the sprocket 108 are driven directly by the drive shaft 78 (FIG. 2). The opposite end of the shaft 112 extends beyond the side plate 102 of the conveyor assembly to drive the sprocket 94 of the mini-conveyor through a gear train made up of gears 122, 124 and 126, and a take-off drive assembly 128 (FIG. 7). The take-off drive assembly includes a shaft 130 which is carried for rotation within a pair of support bearings 132 and 134 and is driven at a first end by meshing helical gears 136 and 138. The helical gear 136 is carried for rotation with the gear 126 and the helical gear 138 rotates with the shaft 130. The second end of the shaft 130 drives the shaft 98 and thus the forward sprocket of the mini-conveyor through a pair of meshing helical gears 140 and 142. The relative rates of cell travel on the mini-conveyor and the main conveyor are thus determined by the parameters of the above-described gear train and by the relative diameters of the drive sprockets 94 and 108. In a preferred embodiment of the present invention, the overall gearing between the mini-conveyor and the main conveyor is 1.9 to 1. Thus, for a typical main conveyor speed of 1 inch per second, the cells on the mini-conveyor would travel at a rate of 1.9 inches per second.

Figure 10:
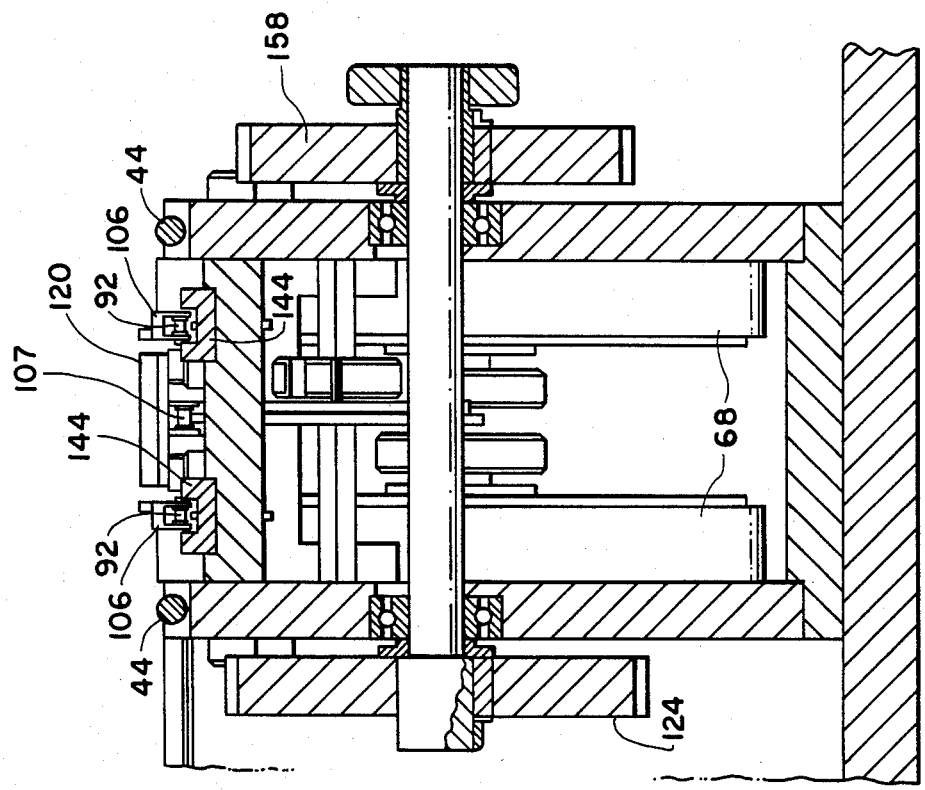
FIG. 10 is an enlarged vertical cross-sectional view taken along the line 10—10 of FIG. 2.
Figure 13:
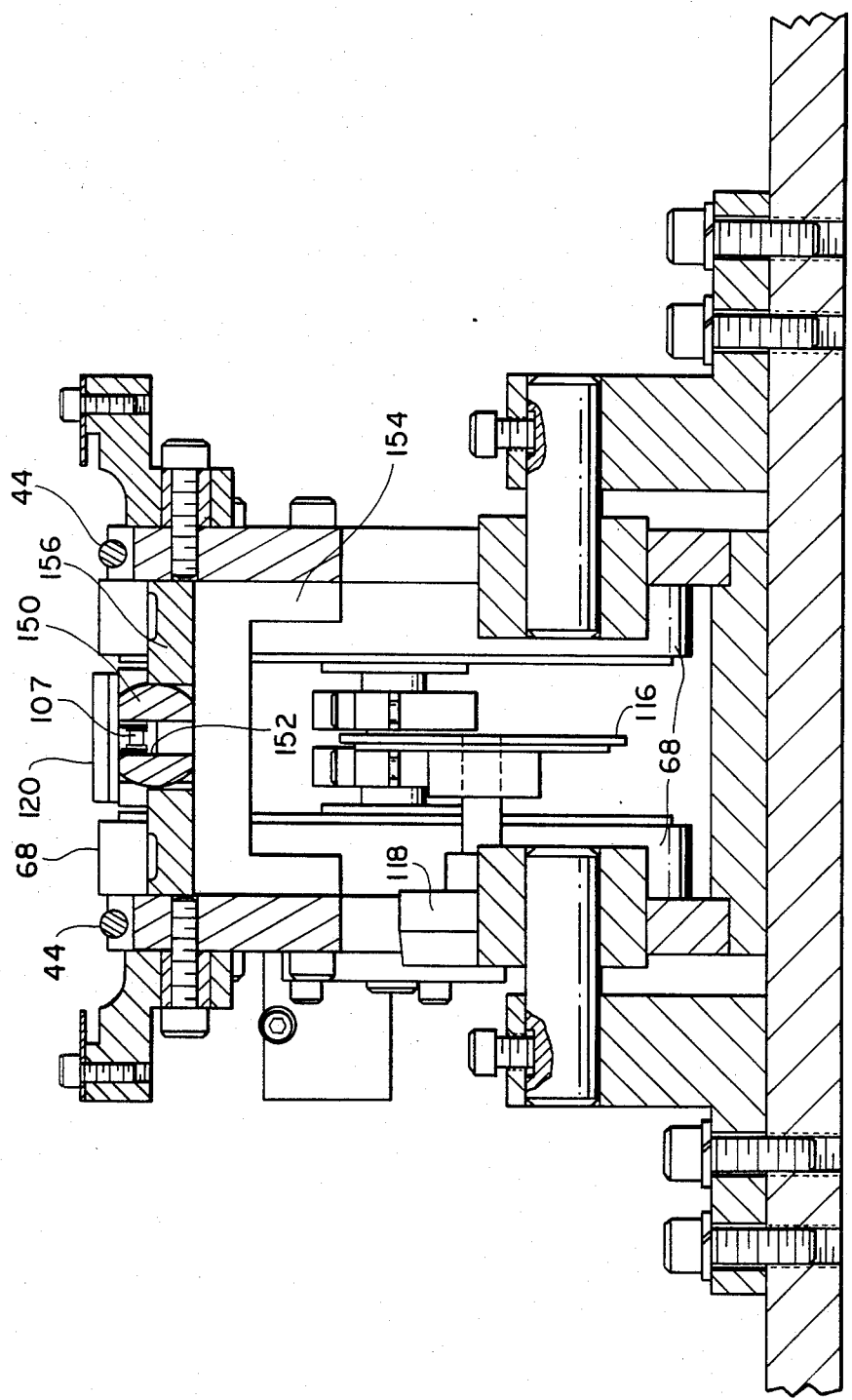
FIG. 13 is an enlarged vertical cross-sectional view taken along the line 13—13 of FIG. 2.

With particular reference to FIGS. 9 and 10, the chains 92 of the mini-conveyor are guided by a pair of longitudinal track elements 144 which are located within recesses 146 of a front cover plate 148. The front cover plate supports the chains and the pusher elements 106 while the pusher elements are engaged with the solar cells, and prevents debris from falling between the side plates 102 and 104. FIG. 13 illustrates a similar structure for the main conveyor wherein the chain 107 is supported midway between the two side plates. Thus, a central track element 150 defines a longitudinal slot 152 which extends down the center of the conveyor assembly and is supported by a series of brackets 154. A rear cover plate 156 extends on both sides of the track element 150 to prevent debris from falling into the machine.

Figure 11:
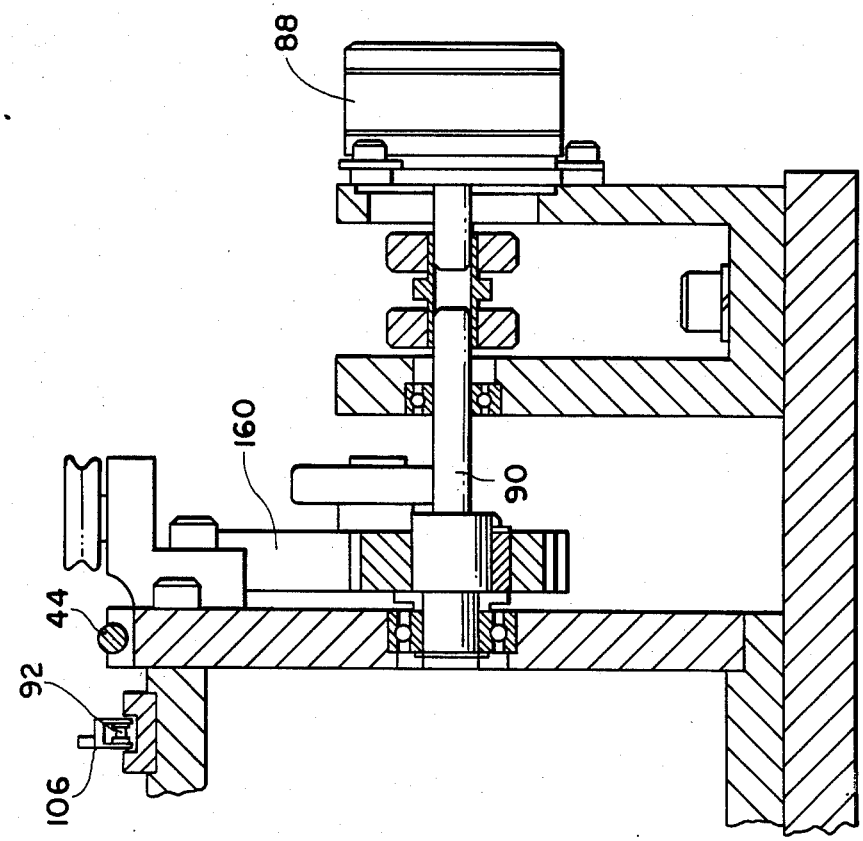
FIG. 11 is a fragmentary enlarged vertical cross-sectional view taken along the line 11—11 of FIG. 2.

The potentiometer 88 is driven with the conveyor assembly, as shown in FIGS. 10 and 11. Specifically, a gear 158 (FIG. 10) is carried for rotation about a common shaft with the gear 124 of the mini-conveyor drive train but on the opposite side of the conveyor assembly. The gear 158 drives a second gear 160 (FIG. 11) of the shaft 90 to drive the potentiometer 88.

Figure 12:
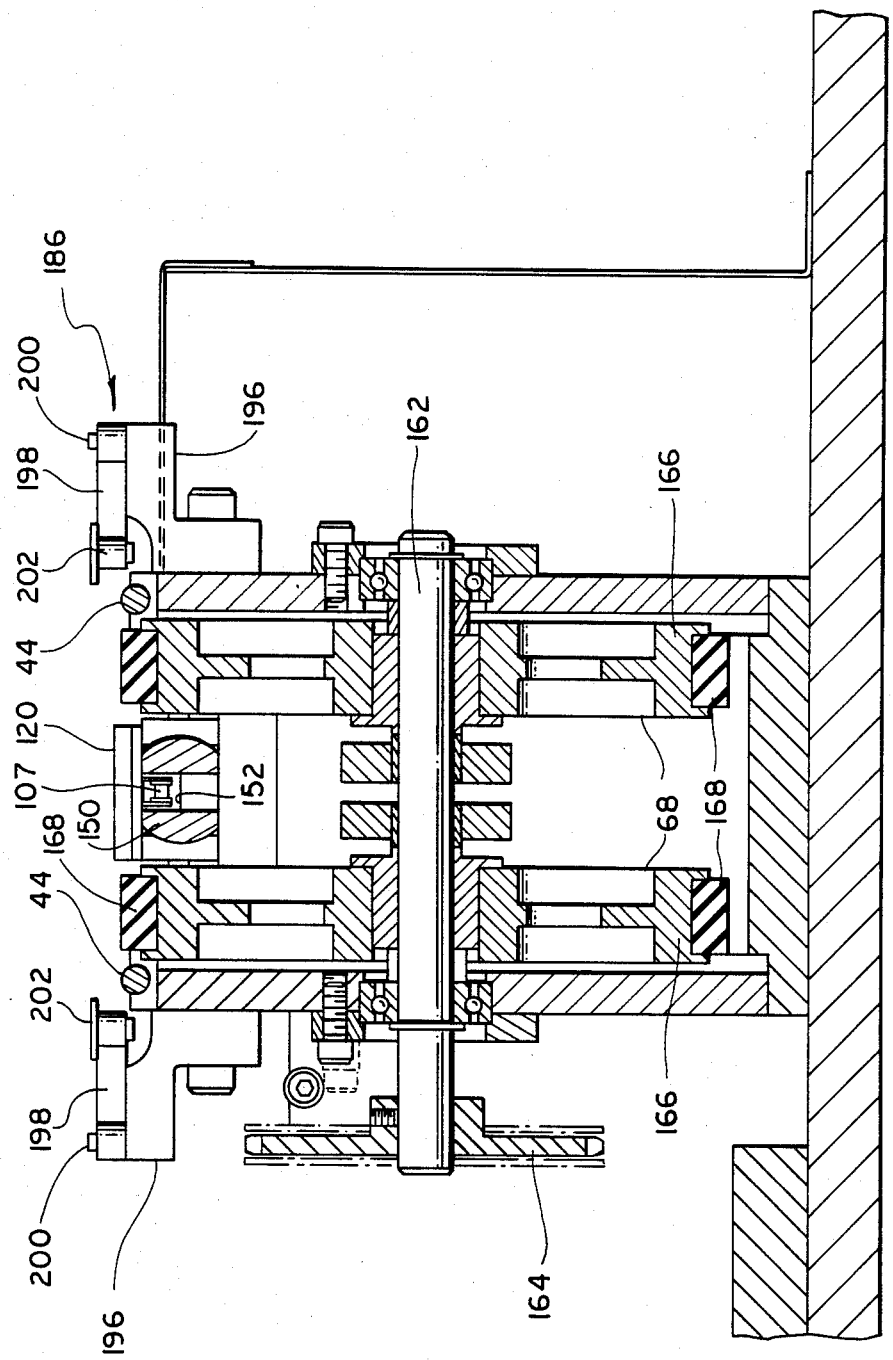
FIG. 12 is an enlarged vertical cross-sectional view taken along the line 12—12 of FIG. 2.

Referring to FIG. 12, the lower solder rollers 68 are mounted for rotation with a transverse shaft 162 which is driven by a sprocket 164 of the second chain drive 84. As described above, the chain drive 84 is coupled to the adjustable ratio mechanism 82 to drive the solder rollers 68 a circumferential speed slightly greater than the speed of the main conveyor. Ideally, the mechanism 82 is adjusted such that the solder rollers draw the cells approximately 0.05 inches (1.3 mm) away from the pusher elements 120 during soldering. The solder rollers 68 preferably comprise metallic wheels 166 having annular resilient tread members 168 at their radially outer surfaces. The tread members 168 may be rubber or other suitable resilient material able to withstand soldering temperatures.

The pusher elements of the present invention are illustrated in FIGS. 15 and 16. FIGS. 15A and 15B show a pusher element 106 of the mini-conveyor chains 92. The lower portion of the pusher element is formed in the shape of a chain link and is provided with a pair of openings 170 for connection into the chain as an integral part thereof. The element 106 has a substantially flat upper surface 172 and a narrow projection 174 extending upwardly therefrom. The projection 174 of each pusher link engages one side of the rear edge portion of a solar cell so that the cell is pushed by the mini-conveyor at a pair of spaced points. The chains 92 and the pusher elements 106 are arranged to accurately align the solar cells as they are moved along the mini-conveyor. A flat "back-up" projection or flange 176 is provided at the rear of each pusher element to prevent the element from canting backwardly under load. The flange 176 bears on the upper surface of the next successive link in the chain, stabilizing the pusher element and thus maintaining alignment of the solar cell being pushed.

Two possible configurations of the main conveyor pusher elements 120 are shown in FIGS. 16A and 16B. For convenience, these elements are referred to herein as elements 120' and 120". Each element comprises a lower portion 178 in the general shape of a chain link and having openings 180 for connection into the chain 107 of the main conveyor. The lower portion 178 supports a laterally extending plate 182 having a pusher bar 184 which extends along the plate and projects upwardly therefrom. The pusher bar bears against the rear edge of a solar cell at a location between the points contacted by the pusher elements 106. The only difference between the elements 120' and 120" is the front-to-back placement of the pusher bar 184. The placement is chosen to provide a uniform spacing between cells on the main conveyor, correcting for the fact that the center-to-center spacing of cells on the main conveyor is not an even multiple of the chain link size. The pusher elements 120' and 120" are also provided with backup flanges 176 which are similar in function and design to the backup flanges of the elements 106.

With reference to FIG. 2, the conveyor mechanism 32 is provided with opposed front guidance rollers 184, center guidance assemblies 186 and rear guidance blocks 188, all for the purpose of maintaining cell alignment throughout cell transport. The front guidance rollers 184 (FIG. 9) are mounted for rotation about fixed vertical axes relative to a pair of mounting brackets 190. The brackets 190 are attached to the side plates 102 and 104, respectively, by a pair of screws 192. A groove 194 is provided at the circumference of each of the rollers for engagement with the outer edge portions of the solar cells. A solar cell which is slightly out of alignment will thus engage one of the rollers 184 and be urged inwardly by the roller. The drag force on the cell is minimized by free rotation of the roller.

The center guidance assemblies 186 are shown most clearly in FIGS. 12 and 14. Each of the guidance assemblies comprises a flanged mounting block 196 carrying a spring arm 198. The spring arm extends inwardly and rearwardly from the outer portion of the mounting block, where it is connected to the mounting block by a rigid pin 200. The arm carries a roller bearing 202 at its innermost end for engagement with the side edge portion of a passing solar cell. The guidance assembly applies a controlled drag force to the edge of the cell, seating the cell squarely against the pusher element 120. The operation of the center guidance assembly is seen most clearly in FIG. 14, wherein the cells travel on the main conveyor in a direction 204. The spring arms force the roller bearings 202 against the passing cell 38, as indicated by the arrow 206. Continued movement of the solar cell urges the bearings in the direction of the arrow 208, against the force of the spring arm. Because the inward forces applied by the two spring arms are exactly opposite to each other, they cancel and produce a net drag force which seats the solar cell firmly back against the pusher element. The roller bearings at the end of the arms minimize undesired frictional forces.

Figure 17:
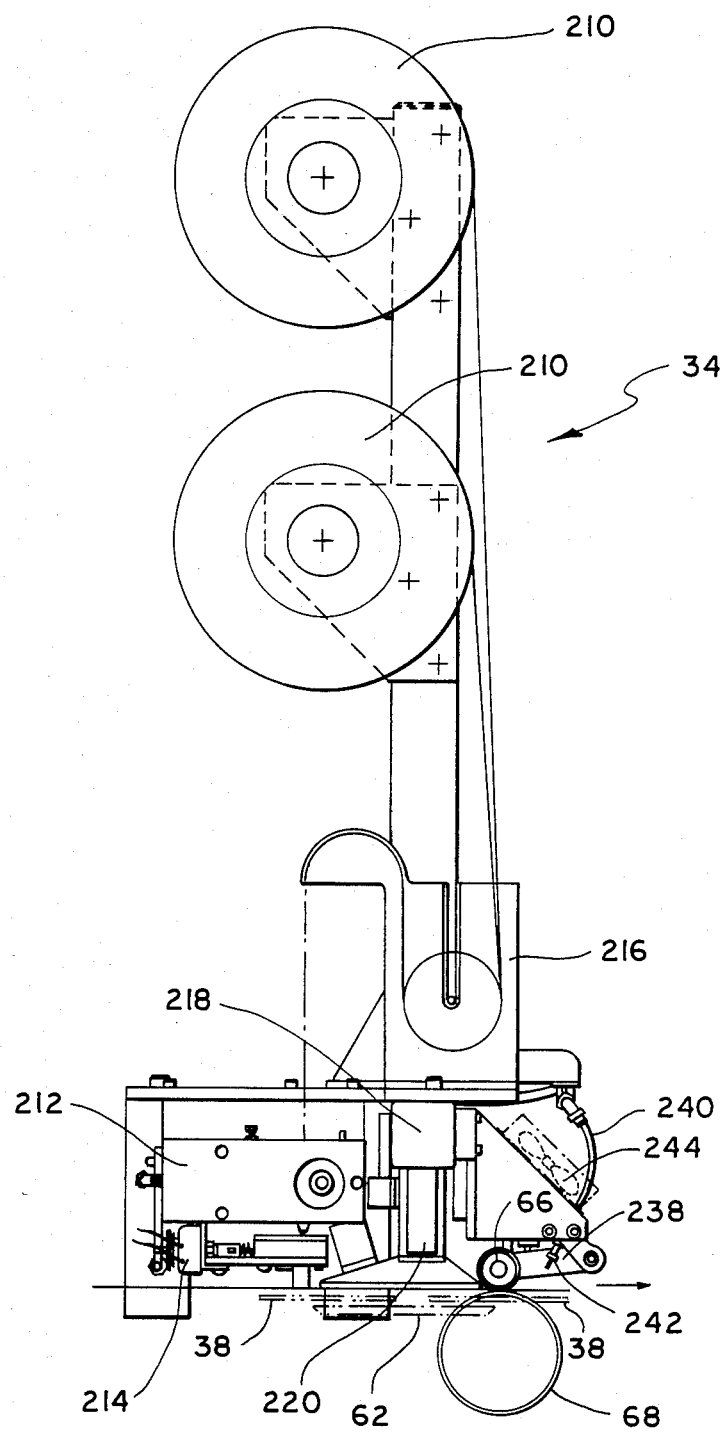
FIG. 17 is a side elevational view of the upper assembly of the solder machine of FIG. 1.
Figure 18:
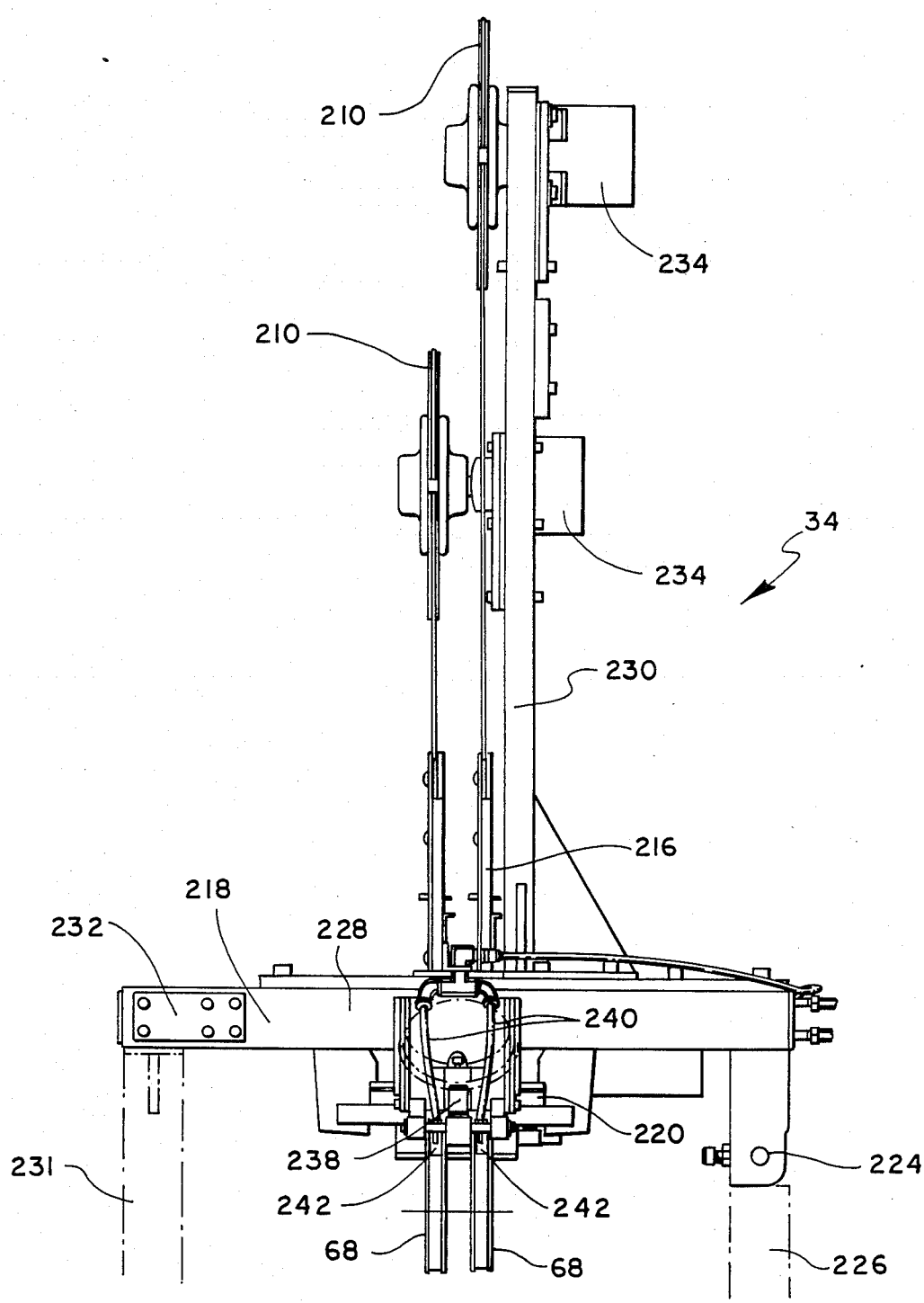
FIG. 18 is a rear elevational view of the upper assembly illustrated in FIG. 17.

Referring now to FIGS. 17 and 18, the upper assembly 34 includes a pair of ribbon supply reels 210 feeding a ribbon drive mechanism 212 and a ribbon shear mechanism 214 through a service loop assembly 216. All of these elements are mounted to a swinging frame 218, along with a heater assembly 220 and the upper solder rollers 66. As seen most clearly in FIG. 18, the frame 218 is mounted by a pin 224 for swinging movement relative to a base frame 226 of the solder machine. The frame includes a horizontal member 228 and a vertical arm 230 which carry the various components of the upper assembly. It can be swung upwardly to the phantom line condition of FIG. 1 to provide worker access to the conveyor assembly 32 and the underside of the upper assembly. The horizontal member 228 is latchable to a portion 231 of the base frame to hold the upper assembly in the operating condition. A microswitch or other sensing device 232 is provided on the horizontal member of the swinging frame to signal whether the frame is in the operating condition. An alarm and an operational lockout can be provided, as discussed below, to assure that the machine is not damaged by use in the unlatched condition.

The ribbon drive mechanism 212 is operated sequentially at two different speeds in response to signals from the control assembly 36 (FIG. 1). Ribbon is drawn from the service loop assembly 216, as needed, and driven downwardly between cells and over cells, as described above. When ribbon is drawn from the service loop assembly, a microswitch (not shown) is activated to cause a pair of synchronous stepping motors 234 to begin unwinding ribbon from the supply reels 210. The unwinding process continues until enough ribbon is unwound to permit the service loop assembly to return to its initial condition and close the switch. When the two phase ribbon drive sequence is completed, the mechanism 214 shears the ribbons in response to a signal from the control assembly, producing two ribbon segments of the desired length.

The heater assembly 220 preferably comprises an infrared (IR) heat lamp which is water cooled and has a sensor for monitoring the temperature of the cell being heated. The lamp is provided with a feedback loop which controls power to the lamp so that the cells are heated to a preselected temperature.

The upper solder rollers 66 are mounted for free axial rotation about the forward end of a pivoting frame 238 which is spring loaded downwardly to urge the upper solder rollers against the lower solder rollers 68. The rollers 66 and 68 engage opposite surfaces of the cells 38 along a pair of spaced lines coinciding with the desired locations of the conductive ribbon segments. The rollers press the ribbons against the solar cells after the cells and the ribbons reach a suitable soldering temperature. Upon exiting the solder rollers, it is desirable to cool the cells rapidly to a temperature substantially below the soldering temperature. This produces a strong solder joint before the soldered combination is subjected to disruptive forces. For this purpose, cooling air may be supplied by a pair of lines 240 to a pair of downwardly directed nozzles 242 directly behind the upper solder rollers. If additional cooling is needed, a fan 244 (shown in phantom) can force additional cooling air onto the cells.

Figure 19:
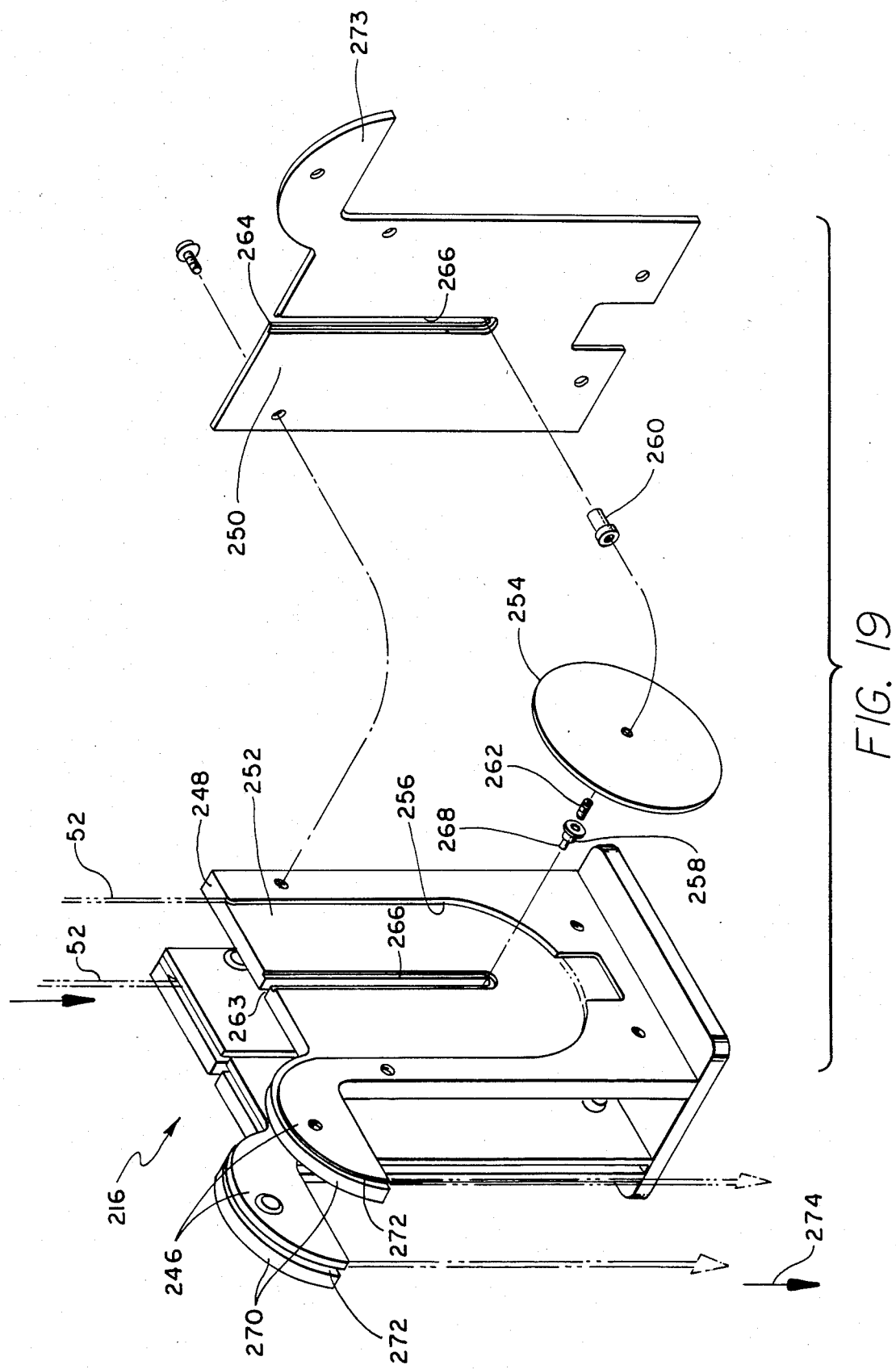
FIG. 19 is an exploded perspective view of a preferred embodiment of a service loop assembly constructed according to the present invention for use in the upper assembly of FIG. 17.

The service loop assembly 216, shown in detail in FIG. 19, includes a pair of side-by-side subassemblies 246, each of which comprises a vertical block 248 and a cover plate 250. One side of the vertical block is provided with a recess 252 for reception of a wheel 254 within a vertical plane. The lowermost portion 256 of the recess is preferably circular in shape and the cover plate 250 is mounted over the recess 252 to define a vertical channel permitting free rotation of the wheel and vertical movement of the wheel under the influence of the ribbon. A pair of hub portions 258 and 260 are threaded to opposite ends of a stud 262 which passes through the center of the wheel. The vertical block and the cover plate are provided with aligned vertical slots 263 and 264 for clearance of the hub portions when the wheel moves vertically within the recess 252. Each of the slots is provided with an appropriate cutaway portion or step 266 conforming to the configuration of the hub portions. The hub portion 258 has an axial projection 268 which extends through the slot 263 for actuation of a microswitch (not shown) which triggers the stepping motors 234. The microswitch is positioned on the back side of the block 248 and opens whenever the wheel 254 is raised above its resting position. The recesses 252 of the vertical blocks 248 extend into the sides of the vertical blocks a distance at least equal to the width of the ribbons 52. The forward edge of each vertical block is provided with an arcuate extension 270 having a cutaway slot 272 for guiding the ribbon as it passes from the wheel. The depth of the slot 272 into the side of the extension 270 is preferably equal to the depth of the recess 252 into the side of the block 248. The ribbon is held within the cutaway slot by a corresponding arcuate portion 273 of the cover plate 250. The ribbon 52 extends downwardly into the recess 252, beneath the wheel 254, back up the recess 252 and over the arcuate extension 270. The final direction of the ribbon is downwardly into the ribbon drive mechanism, as indicated at 274.

Actuation of the ribbon drive mechanism draws ribbon from the service loops formed within the recesses 252, raising the wheels 254 from their rest positions. This opens the two microswitches (not shown) of the subassemblies 246, activating the motors 234 of the supply reels 210. When the ribbon feed operation ends or the motors 234 have otherwise paid out enough ribbon to compensate for that drawn by the ribbon drive mechanism, the wheels 254 reassume their rest positions and discontinue the signal to the stepping motors. An ample supply of ribbon is thus supplied to the ribbon drive mechanism under all conditions and at a constant tension, permitting the drive mechanism to consistently draw the same amount of ribbon for each ribbon segment and preventing the ribbon from becoming tangled or stretched.

Figure 20:
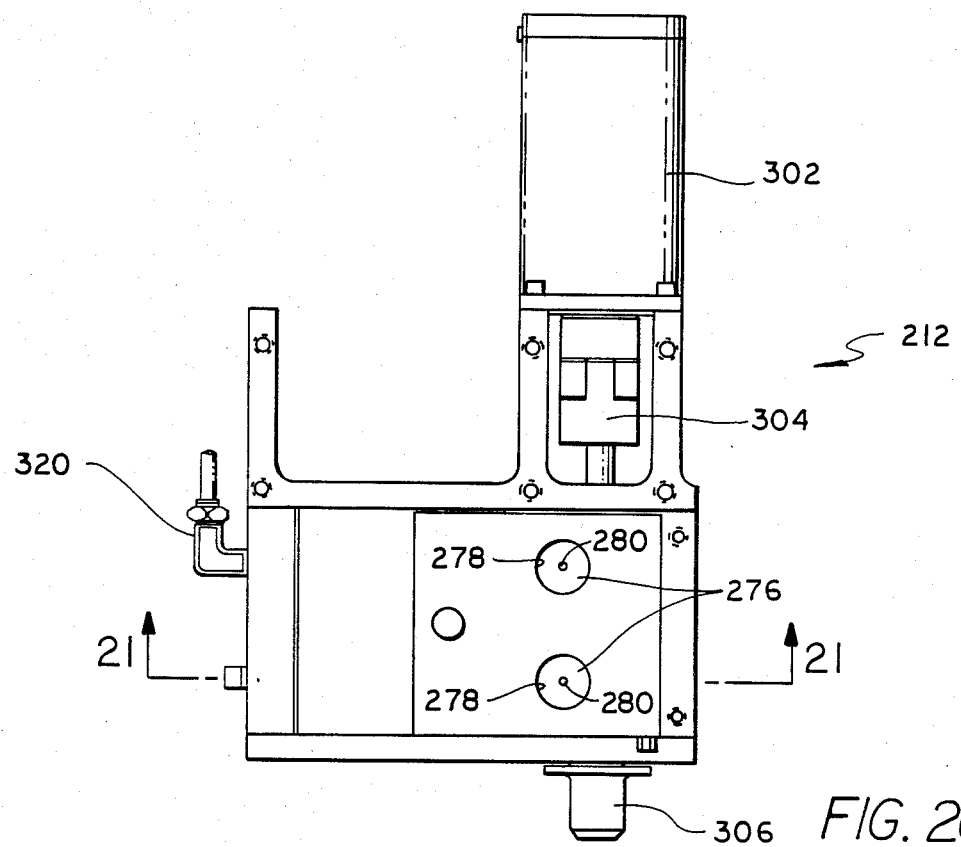
FIG. 20 is a top plan view of a ribbon drive mechanism of the upper assembly of FIG. 17, shown in isolation.
Figure 21:
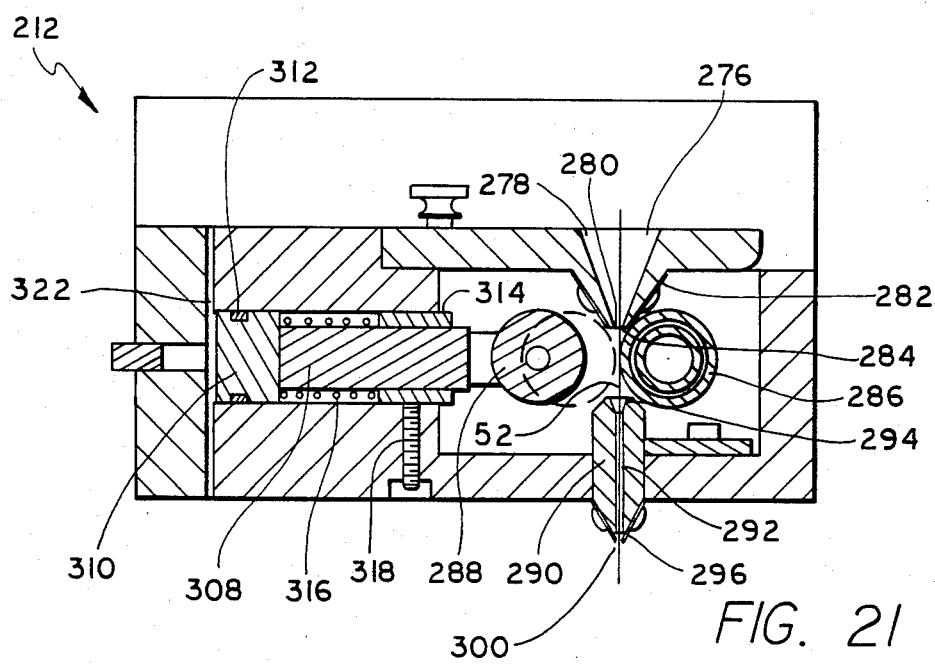
FIG. 21 is a vertical sectional view taken along the line 21—21 of FIG. 20.

The ribbon drive mechanism 212 is shown in isolation in FIGS. 20 and 21. Ribbon enters the mechanism in a downward direction through a pair of upper ribbon guide ports 276 which are tapered from an upper end 278 to a lower end 280. The lower end 280 is further restricted by a pair of adjustable guide plates 282 which converge to a narrow slot 284 at a point beneath the lower end 280. The plates 282 converge at an angle greater than the angle at which the ports 276 are tapered. The ribbon 52 extends downwardly from the slot 284, passing between a drive roller 286 and an idler roller 288 to a middle ribbon guide 290. The middle ribbon guide has a central bore 292 extending downwardly from a tapered upper portion 294 to a pair of restrictive guide plates 296 which are similar to the guide plates 282. Ribbon is therefore conducted smoothly through the drive mechanism and exits through a restricted slot 300 at the base of the middle ribbon guide.

The drive roller 286 is driven by a stepping motor 302 which acts through a drive coupling 304. The drive roller can also be actuated manually by a knob 306, as an aid in setting up the apparatus. The idler roller 288 is mounted for reciprocal movement between a first withdrawn position (showing in full lines in FIG. 21) and a second engaged position (shown in broken lines in FIG. 21). The idler roller is mounted for free rotation at the end of a piston rod 308 having a piston 310 and a piston ring or seal 312. The piston rod 308 reciprocates relative to a bushing 314 and is biased toward the withdrawn position by a return spring 316. The bushing 314 is held in place by a set screw 318. The housing of the drive mechanism is provided with a pressure inlet fitting 320 which communicates with the piston 312 through an air passage 322. The piston and the idler roller can thus be urged to the engaged condition by air pressure applied to the inlet 320 prior to activating the stepping motor 302. This causes each of the ribbons 52 to be confined in a driving relationship between the corresponding idler roller 288 and the drive roller 286, preventing slippage of the ribbon and insuring that precisely the desired amount of ribbon is paid out.

Figure 22:
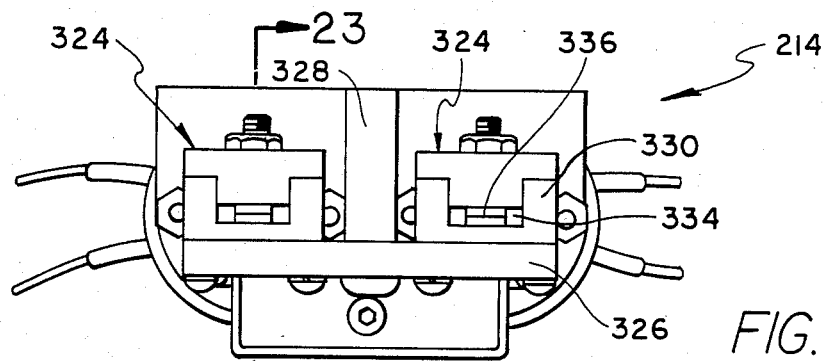
FIG. 22 is a rear elevational view of a ribbon shear mechanism of the upper assembly of FIG. 17, shown in isolation.
Figure 23:
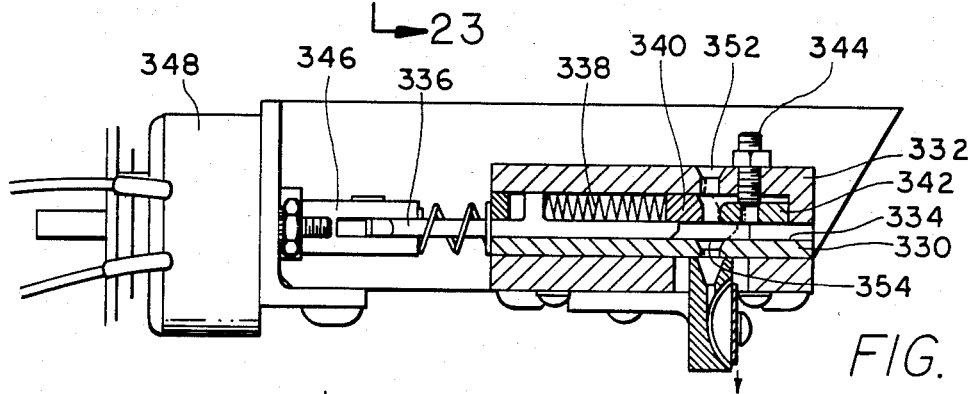
FIG. 23 is a partial vertical sectional view taken along the line 23—23 of FIG. 22.
Figure 24:
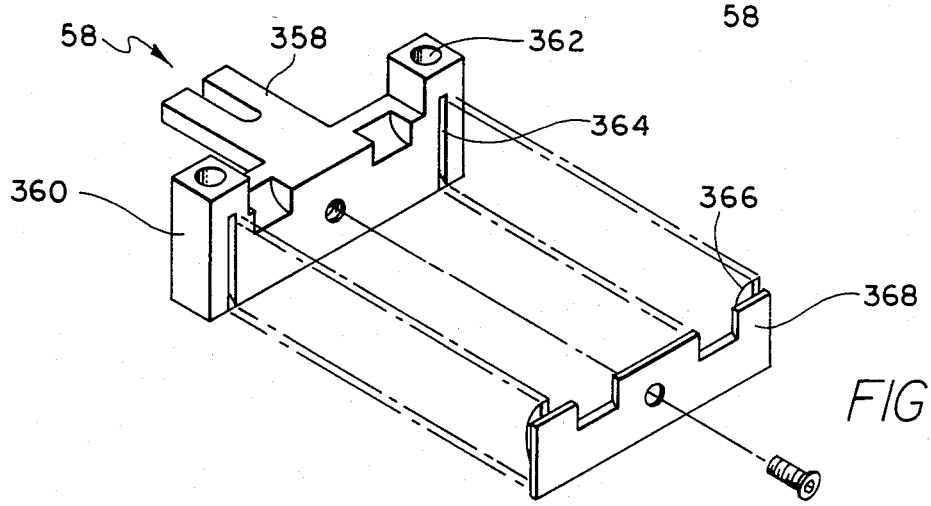
FIG. 24 is an exploded perspective view of a lower ribbon guide assembly of the ribbon shear mechanism.

FIGS. 22 and 23 illustrate the ribbon shear mechanism 214 in isolation. The shear mechanism comprises a pair of side-by-side shear devices 324 mounted to a base plate 326 and separated by a vertical mounting plate 328. Each of the shear devices has a "U"-shaped shear housing 330 which is covered by a top plate 332 to define a longitudinal passage 334. An active shear block 336 is received for longitudinal sliding movement along the passage 334 from a retracted position shown in full lines in FIG. 23 to an activated position shown in broken lines. Upon moving from the retracted to the activated positions, the active shear block acts through a compression spring 338 to urge a ribbon gripping member 340 against a static shear block 342. This serves to secure the ribbon as the active shear block moves to a condition of cutting engagement with the static shear block. The static shear block is held in place by a set screw 344, and the active shear block is connected to a clevis-type actuator 346 of a solenoid 348. The solenoid is actuable to drive the active shear block from the retracted to the activated condition when the ribbon feed operation has been completed.

Ribbon passes to the shear mechanism 214 from the middle ribbon guide 290 of the ribbon drive mechanism. It passes through a passage 352 of the top plate 332 and between the active and static shear blocks. The middle ribbon guide is preferably no more than approximately 0.5 inches (13 mm) in length and the total distance between the ribbon drive roller 286 and the shear block 342 is preferably no more than approximately 1 inch (25 mm). The proximity of the shear to the drive roller thus minimizes the possibility that the ribbon will jam as it is pushed by the drive roller through the shear mechanism. The ribbon exits the shear housing 330 through a similar passage 354 and the lower ribbon guide assembly 58.

The lower ribbon guide 58 comprises a mounting flange 358 which carries a pair of spaced guide blocks 360. Each guide block has a tapered entry port 362 at its upper end and an arcuate slot 364 extending downwardly from the entry port and opening toward the rear. Each slot is partially filled by an arcuate segment 366 of a cover plate 368. The space between each arcuate slot and corresponding segment 366 provides a ribbon guide passage extending downwardly and rearwardly from the tapered entry port 362, which passage is tapered in the direction perpendicular to the surface of the ribbon. The resulting assembly 58 is uniquely suited to guiding the conductive ribbon, without jamming, as it is forced under a cell which has passed it on the main conveyor.

Figure 25A:
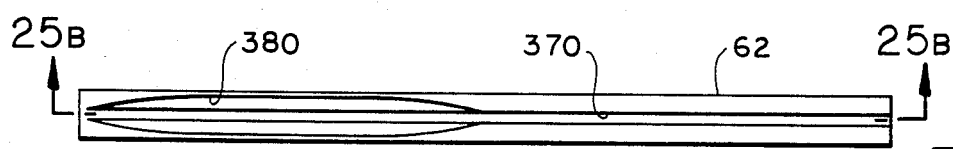
FIG. 25A is an enlarged plan view of a ribbon guide trough of the solder machine of FIG. 1.
Figure 25B:
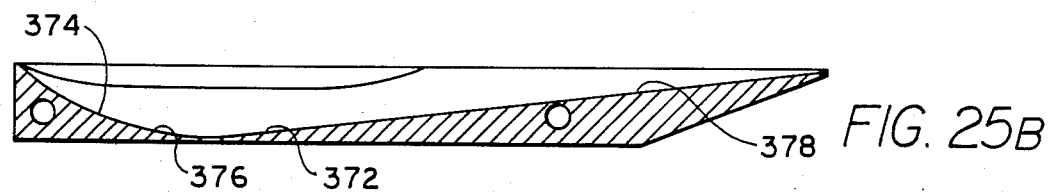
FIG. 25B is a vertical sectional view taken along the line 25B—25B of FIG. 25A.

The ribbon guide troughs 62, which receive the ribbons passed from the lower ribbon guide assembly 58, are illustrated in FIGS. 25A and 25B. Each trough has a pair of vertical side walls 370 and an arcuate bottom wall 372 for reception of the ribbon being pushed under the cell. A first portion 374 of the arcuate bottom wall is directed at substantially the same angle as the output passage or port of the guide assembly 58. This provides a smooth transition for the ribbon and minimizes jamming. An intermediate portion 376 of the bottom wall is more sharply curved, turning the ribbon rearwardly and eventually upwardly toward the bottom of the passing cell. The final portion 378 is inclined upwardly toward the bottom of the cell and the solder rollers. The upper ends of the vertical side walls 370 may be flared outwardly, as shown at 380, along a portion of the trough. By virtue of this outward flare, the ribbon can be more effectively guided into the trough without jamming. The arrangement of the trough 62 relative to the ribbon guide 58 and the solder rollers is shown in FIGS. 3 and 5.

Figure 26:
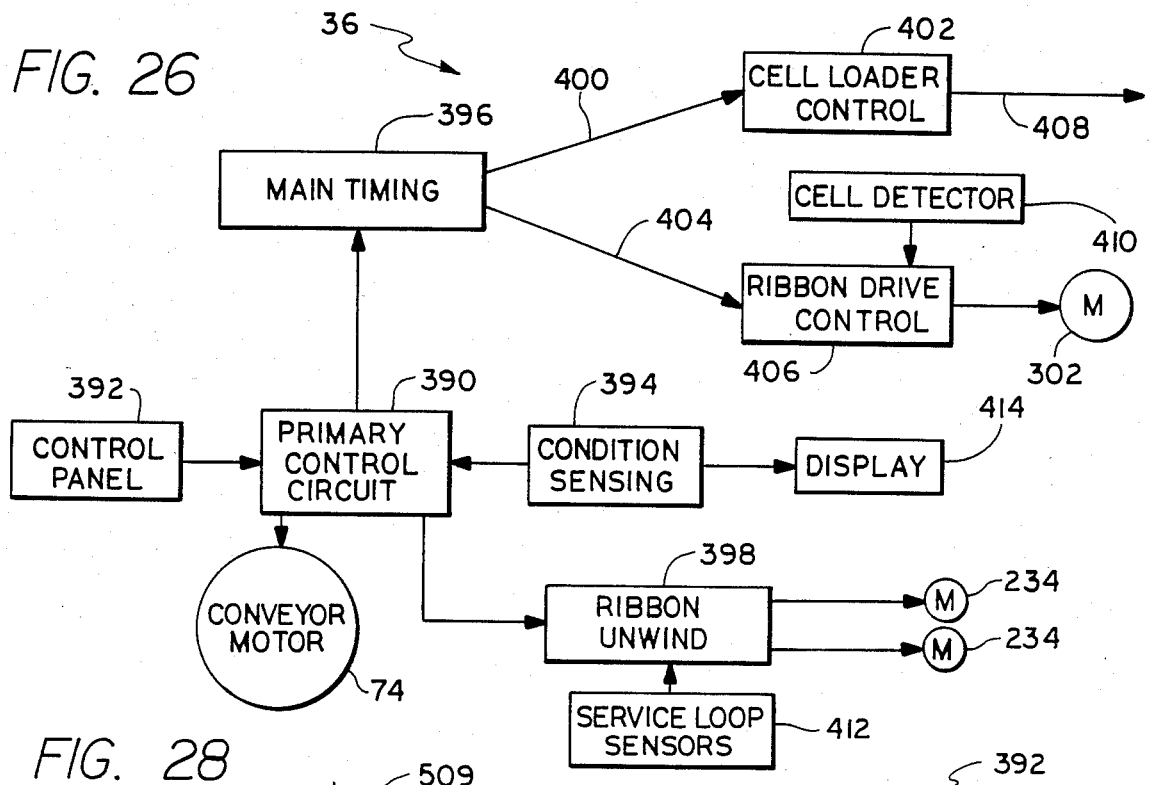
FIG. 26 is a simplified block diagram of the automatic solder machine of FIG. 1.

Referring now to FIG. 26, the control assembly 36 includes a primary control circuit 390 which receives inputs from a control panel 392 and condition sensing circuitry 394 to control the conveyor motor 74, main timing circuitry 396 and ribbon unwind circuitry 398. The condition sensing circuitry also provides operational information to a display 414. The main timing circuitry 396 generates a first timing output along a line 400 to a cell loader control circuit 402 and a second output along a line 404 to ribbon drive control circuitry 406. The loader circuitry 402 responds to the first output signal by producing an appropriately timed output 408 which causes the cell loader 37 (FIGS. 1 and 2) to place a cell on the mini-conveyor. The ribbon drive control acts in response to the second output of the main timing circuitry to apply a preselected sequence of pulses to the ribbon feed stepping motor 302. The sequence of pulses comprises a fast pulse train for driving the motor 302 through the fast portion of the ribbon feed cycle, followed by a second slower pulse train for driving the motor at a slower rate. A cell detector 410 (shown only in FIGS. 26 and 27C) determines whether or not the next cell position is occupied and causes the second pulse train to be extended if it is not occupied. Additional ribbon is thus paid out if a cell is missing to bridge the gap to the next succeeding cell. The cell detector 410 preferably includes a light source and a light detector (not shown) arranged to sense the presence of a reflective portion of a solar cell just prior to the ribbon feed location 50 (FIG. 2).

The ribbon unwind circuitry 398 is activated during the ribbon feed operation to unwind sufficient ribbon from the supply reels 210 (see FIG. 17) to return the wheels of the service loop assembly 216 (FIG. 19) to their "rest" positions. To accomplish this, an unwind signal is applied to the reel motors 234 whenever sensors 412 (also shown only in FIGS. 26 and 27C) detect that the corresponding wheel of the service loop assembly is raised from its rest position. As described above, the service loop sensors may be simple microswitches arranged to detect when the hub portions 258 of the service loop wheels are raised.

The control assembly 36 is shown in greater detail in FIGS. 27A through 27C, and FIG. 28 illustrates the face of the control panel 392. The control panel appears in FIG. 27 as a bank of flip-flops 416 through 442, each of which is labeled in FIG. 27 according to the function that it controls. Many of these flip-flops are controlled at least partially by push-switches of FIG. 28. For simplicity, each push-switch bears the same number as the corresponding flip-flop of FIG. 27. Some of the flip-flops are also set by an "auto" signal generated by the control assembly.

The primary control circuit 390 comprises a number of simple circuits for controlling isolated functions of the solder machine 30 in response to the flip-flops 416 through 442 acting through a logic network. The simple control circuits include a ribbon air controller 444, a heat lamp controller 446 and a conveyor controller 448.

The ribbon air controller 444 causes ribbon air to be provided to the nozzles 242 of FIG. 18 in response to a positive output from an OR gate 450. It may control a simple air valve, a pump arrangement or the like.

The heat lamp controller 446 controls the power to a lamp 452 which is used as an infrared heater of solar cells and ribbons in the machine 30. The circuit 446 controls current to the lamp in response to an analog temperature signal generated along an output 454 of a cell temperature sensor 456 (shown only in FIG. 27B). The temperature sensor thus establishes a feedback loop to the controller 446. The controller 446, the lamp 452 and the sensor 456 are all commercially available items and correspond to the heater assembly 220 of FIG. 17. The lamp 452 is preferably a 6-inch infrared heat lamp of the type sold by Research Inc. as Model No. 12000 T3/CI, with a parabolic reflector, and the controller 446 is preferably a conventional ac phase controller that produces an ac output voltage proportional to a dc control voltage.

The heat lamp controller 446 is activated by the output of an OR gate 458 to apply an ac output to the lamp 452. The output is dependent on the signal from the temperature sensor 456 but is always at least a preselected bias value. The temperature sensor 456 may be an infrared camera whose output is a dc analog voltage proportional to the temperature of a cell being heated. The controller 446 compares the analog voltage to a set point 460 and adjusts the ac output to the lamp so that the cell reaches a preselected temperature corresponding to the set point. The feedback loop controls the output to the lamp whenever the analog voltage is within its usual operating range, signifying that a cell is in position to be heated. In all other cases, the ac output voltage of the controller 446 drops to a preselected standby or "bias" value which powers the lamp at a lower level. However, the output of the controller 446, and thus the intensity of the lamp 452, can also be maintained at a relatively high value by a signal applied to an "override" input 464. This feature is useful at the end of a string or when one of the cell positions in a string is vacant. The control circuitry can then be overridden to maintain the lamp at a high intensity so that the trailing edge of the last successive cell is fully heated.

The conveyor controller 448 powers the conveyor motor 74 in response to a "high" output from an OR gate 466. Two additional components of the primary control circuit are the ribbon shear solenoids 348 (FIGS. 22 and 23) which are activated through an OR gate 468, and a lamp coolant solenoid valve 470 which is activated through an OR gate 472.

Of the various OR gates described above, the gates 450, 466 and 472 each have one input tied to the output 474 of an AND gate 476 which is inputed by the "auto/standby" flip-flop 422. The functions of ribbon air, conveyor operation and lamp coolant flow are thus activated when the output of the gate 476 goes high.

Similarly, one of the inputs of the OR gate 458 is tied to the output of a 3-input AND gate 478 which receives one of its three input signals from the output of the auto/standby flip-flop 476. The other two inputs of the AND gate 476 are connected to the outputs of a lamp coolant sensor 480 and a conveyor motion sensor 482, permitting the heat lamp to be activated by the auto/standby flip-flop 422 only when coolant is flowing through the lamp and the conveyor is moving. This prevents damage to the conveyor and the lamp.

The second inputs to the OR gates 450, 466 and 472 are connected to AND gates 484, 486 and 488, respectively, for activating the ribbon air, conveyor motion and lamp coolant functions on a manual basis. One input to each of these AND gates is tied to the output 490 of the "manual" flip-flop 424. The other input is tied to the flip-flop corresponding to the function with which the AND gate is associated. That is, the AND gate 484 is tied to the "ribbon air" flip-flop 426, the AND gate 486 is tied to an OR gate 492 which is activated by either the "conveyor run" flip-flop 436 or the "conveyor jog" flip-flop 438, and the AND gate 488 is tied to the "lamp coolant" flip-flop 432. In the absence of any inhibiting conditions, each of these functions can be commenced by activating both the "manual" flip-flop 424 and the flip-flop of the corresponding function. In the case of the ribbon shear solenoid 348, a first input 492 of the OR gate 468 is tied to the output of an AND gate 494 which receives inputs from the "manual" flip-flop 424 and the "ribbon shear" flip-flop 430. When the "manual" flip-flop is "on", the shear solenoid 348 can be operated through the "ribbon shear" flip-flop 430. The second input to the OR gate 458 of the heat lamp controller 446 is also tied to an AND gate 496 for manual actuation of the heat lamp. The AND gate 496 has 3 inputs connected to the "heat lamp" flip-flop 434, the lamp coolant sensor 480 and the conveyor motion sensor 482, respectively. In the manual mode, the heat lamp is therefore subject to the same operational restrictions as in the automatic mode; that is, the lamp coolant must be flowing and the conveyor must be "on".

The condition sensing circuitry 394, some of which has been described above, comprises a number of sensors for monitoring particular conditions of a solder machine 30 and providing useful information as to those conditions. The various sensors include the cell temperature sensor 456, the lamp coolant sensor 480, the conveyor motion sensor 482, a ribbon air pressure sensor 498 and a lamp current sensor 500. These sensors have corresponding alarm LED's 501 through 505, respectively, which are lit when the individual function reaches a preselected alarm state. For example, the cell temperature LED 501 is lighted by the sensor 456 when the cell temperature falls outside of a preselected safe operating range. The LED's 502 and 505 are lit when either lamp coolant or lamp current, respectively, is not flowing; the LED 503 is lit when the machine is "on" but the conveyor is not moving; and the LED 504 is lit when ribbon air is not applied to the ribbon drive mechanism 212. The signals to the LED's 502, 503, 504 and 505 are also applied to a multi-input NOR gate 506 whose output is tied to the second input of the auto/standby AND gate 476. Thus, the alarm signals to the various LED's provide the second input required to initiate the automatic phase of operation, the first input being that of the auto/standby flip-flop 422. If an alarm exists in any of the sensed aspects of the machine 30, the output along the line 507 from the NOR gate 506 will be low, inhibiting the system from going into the automatic/standby mode. It is only when each of the inputs to the gate 506 is low that the output along the line 507 will be high, enabling the machine to enter the auto/standby mode.

Finally, a number of the sensors of the sensing circuitry 394 provide an analog output for display by the controller 508 and the digital display 509. Thus, the cell temperature sensor 456 sends an output to the display controller 508 along a line 510. The lamp coolant sensor 480, the ribbon air pressure sensor 498 and the lamp current sensor 500 provide similar analog signals to the display controller along the lines 512 through 516.

Figure 28:
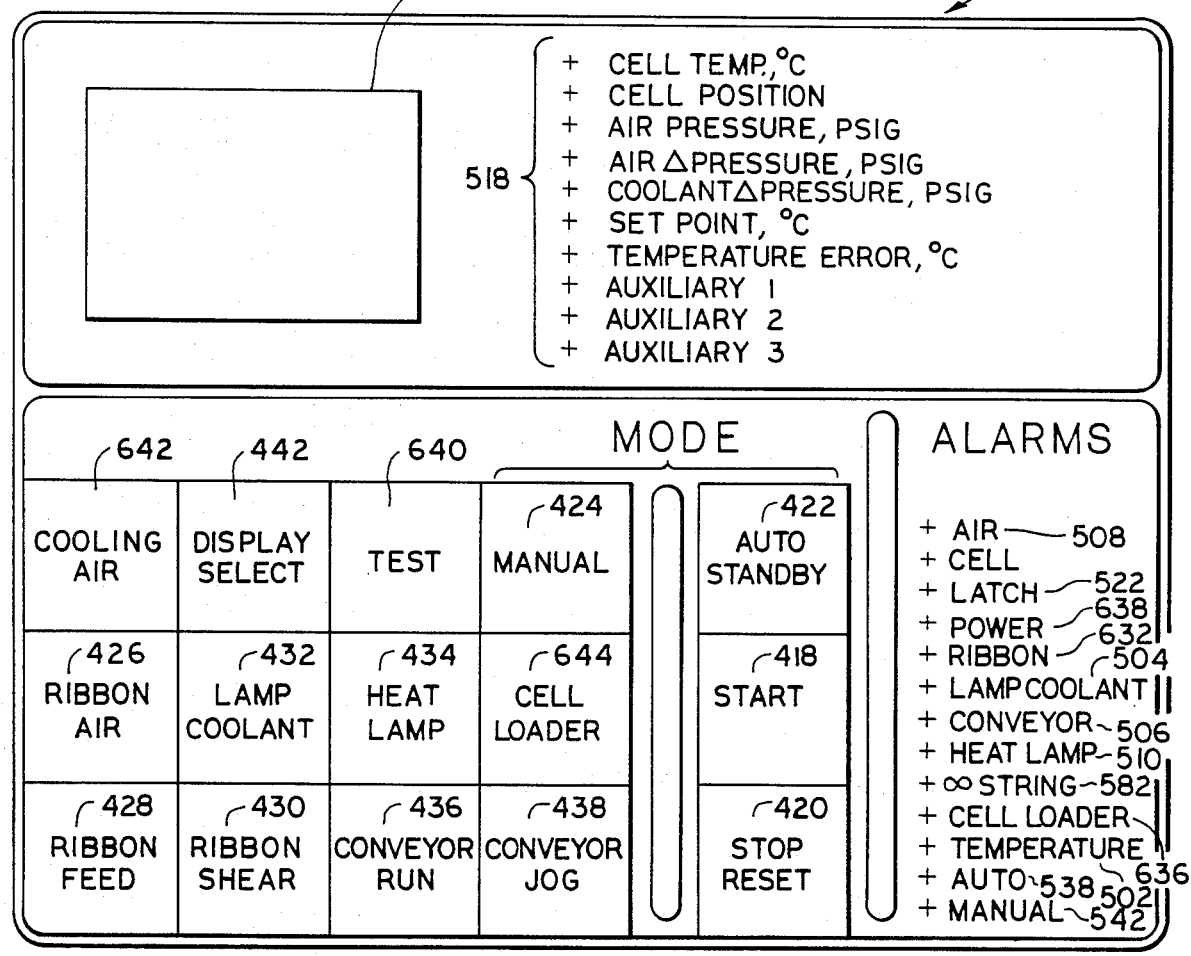
FIG. 28 illustrates a control panel constructed in accordance with the preferred embodiment of the present invention.

With reference to the control panel 392 of FIG. 28, the alarm LED's discussed above are found in the lower right hand portion of the control panel. The digital display 509 is found in the upper left hand portion. It preferably takes the form of a digital voltmeter for displaying the analog data from the sensors. At any point in time, the digital display 509 bears information as to one of the conditions listed in the upper right hand corner of the control panel. The particular condition as to which information is being displayed is indicated by illumination of one of the LED's 518. The item indicated on the display progresses sequentially through the list in reponse to a signal from the "display select" push-switch 442 to the display controller 508 (FIG. 27).

An additional alarm signal is produced when a signal from the microswitch 232 of the upper assembly 34 (FIG. 18) indicates that the upper assembly is unlatched. The "latch" flip-flop 440 of FIG. 27 is activated by the microswitch to complete a sensing circuit in a latch sensor 520. The latch sensor sends an appropriate alarm signal to an LED 522 and an additional input to the NOR gate 506 if the upper assembly is unlatched. The machine is then prevented from entering or staying in the automatic mode as a safety feature.

The main timing circuitry 396 comprises a comparator 524 for comparing a position signal from the servo potentiometer 88 with a reference signal from a preset potentiometer 526. When the two signals are equal, a pulse is generated along an output line 528 to an inhibitor 530. The pulses comprise a main timing signal which is the "heart beat" of the machine in the automatic mode. Each pulse corresponds to a movement of the conveyors equal to the center-to-center spacing of cells thereon. The phase of the main timing signal can be adjusted through the reference potentiometer 526. The inhibitor 530 comprises conventional circuitry to inhibit the main timing signal unless a high signal is detected at a control input 532, whereupon it applies the timing signal to its output 534. When the signal is passed by the inhibitor, an output 536 is energized to illuminate an "auto" LED 538 and at all other times an output 540 is energized to illuminate a "manual" LED 542. When the control input 532 is energized, the main timing signal passes simultaneously to an adjustable delay 544 and a 3-bit shift register 546. The delay 544 again shifts the phase of the main timing signal and applies it along the line 400 to the loader control circuit 402 for loading cells onto the mini-conveyor. The 3-bit shift register delays the pulses reaching it a period corresponding to 3 cell lengths. This accounts for the distance between the cell loading position and the ribbon feed location on the conveyor assembly 32. The delayed pulses are applied through an adjustable delay 548 and the line 404 to the ribbon drive control 406. These pulses trigger a ribbon feed motor controller 550 to initiate the ribbon drive sequence for each cell. The operations of cell loading and automatic ribbon feed are therefore dependent upon application of a high signal to the control input 532 of the inhibitor 530. The control input 532 is connected to the output of an AND gate 552 which has one input connected to the output 474 of the auto/standby AND gate 476 and the other input connected to the "start" flip-flop 418. Deactivation of the inhibitor 530 to start the cell unloading and ribbon feed operations is thus accomplished by setting the auto/standby flip-flop 422 and the start flip-flop 418 when no general alarm is present, as indicated by the output of the NOR gate 506.

The phase shifted main timing signal on the line 400 acts upon a loader controller 554 to produce a signal 408 to a cell loader 37 (FIGS. 1 and 3). The cell loader may be a conventional ram-type device for pushing solar cells sequentially from standard solar cell cassettes to a first work station. The loader controller is a simple circuit which passes the main timing signal to the cell loader unless an "inhibit" signal is received at a control input 558. A presettable counter 560 counts the pulses on the line 400 and generates the inhibit signal at appropriate times to produce a number of strings of cells separated by the spacing of one cell.

The counter 560 comprises a counter/comparator 562 and a presettable selector 564. The selector 564 applies a signal to an input 566 of the counter/comparator corresponding to one of three preset string lengths 568, 570 or 572. The counter/comparator counts the pulses along an input 574 from the line 400, up to the number currently indicated by the selector 564. When the number of counts reaches the number of cells in the preset string length 568, the inhibit signal is passed to the loader controller along the input 558 and an "advance" signal is passed to the selector along the line 576. The advance signal causes the selector to switch to the next preset string length, in order, and apply an output corresponding to that length along the counter input 566. The presettable counter 560 thus provides inhibit signals to the loader controller 554 at the appropriate times to produce a desired series of spaced strings of solar cells. The strings can be of up to three different lengths by virtue of the presets 568 through 572.

In some instances it will be desired to produce a continuous string of solar cells without vacancies. This is accomplished by activating an "infinite string" selector 578 to open a relay 580 between the counter/comparator 562 and the control input 558. The inhibit signals are then unable to reach the loader controller, causing a cell to be loaded onto the conveyor for each pulse of the main timing signal. When the infinite string selector 578 is activated, it illuminates a corresponding display LED 582 of the control panel 392.

As described above, the ribbon drive control 406 acts in response to delayed main timing pulses along the line 404 to drive a pair of conductive ribbons beneath each cell and over the succeeding cell to form a string of cells connected in series. The ribbon drive control comprises the motor controller 550, a "fast" counter/comparator 584 and a "slow" counter/comparator 586. The controller 550 is an oscillator capable of producing a series of fast pulses followed by a series of slow pulses. The design of such an oscillator, and of the counter/comparators 584 and 586, will be apparent to a worker skilled in the art from the following description.

Delayed main timing pulses from the line 404 are applied to an input 588 of the controller 550 to initiate the ribbon drive sequence for each cell. The controller begins issuing a rapid pulse train to the ribbon feed stepping motor 302 in response to each pulse. The pulses are also applied to a counting input 590 of the "fast" counter/comparator 584. Upon reaching the value of a preset 591 which corresponds to a desired length of ribbon fed under the cell, the counter/comparator 584 issues a signal from an output 592 to reset the "slow" counter/comparator 586 and provide a "slow" start signal to an input 594 of the controller 550. The "slow" start signal terminates the fast pulse train and commences a slow pulse train which is preferably one tenth as fast. The pulses are ussued to the motor 302 and applied to a counting input 596 of the "slow" counter/comparator 586. The slow pulse train causes ribbon to be paid out at the speed of the main conveyor so that the ribbon falls onto the top of the succeeding cell as it passes the ribbon feed location. The counter/comparator 586 counts the pulses until a preset value is reached. In the normal case, this value corresponds to the value of a "short" preset 598 and causes ribbon to be paid out until it extends the length of the succeeding cell. When the count reaches the value of the short preset 598, a "stop" signal is issued by the counter/comparator 586 along an output 600. The "stop" signal passes to a second input 602 of the OR gate 468 to shear the ribbons and simultaneously passes to an input 604 of the controller to terminate the pulse train. If, on the other hand, a cell is missing from the conveyor because the loader controller 554 was inhibited by the presettable counter 560, the cell detector 410 will signal the counter/comparator 586 to count pulses until it reaches the value of a "long" preset 606. The counter/comparator 586 will then continue counting pulses until enough ribbon is paid out to extend across the gap between cells and over the top of the next succeeding cell. Only then will it issue a stop signal to shear the ribbons and stop the controller. As a result, the cells produced by the soldering machine 30 will be connected in a continuous series which can be cut apart later, as desired, to arrange the individual strings of cells into a desired configuration. When the counter/comparator 586 is caused to count to the value of the long preset 606, the additional pulses, or some of them, can be applied to the override input 464 of the heat lamp controller 446 along an output line 608. The lamp 452 will then stay "on" for at least a portion of the period between the cells, causing the last cell before the gap to be fully heated by the lamp.

The ribbon feed motor controller 550 is also actuable manually by a "high" signal along an input 610. The input 610 is connected to the output of an AND gate 612 having three inputs connected to the output 490 of the "manual" flip-flop 424, the output of the "ribbon feed" flip-flop 428 and an output 613 of the ribbon air pressure sensor 498. Ribbon can thus be fed manually only when the system is in the manual mode and air pressure is supplied to the ribbon feed mechanism.

Figure 27A:
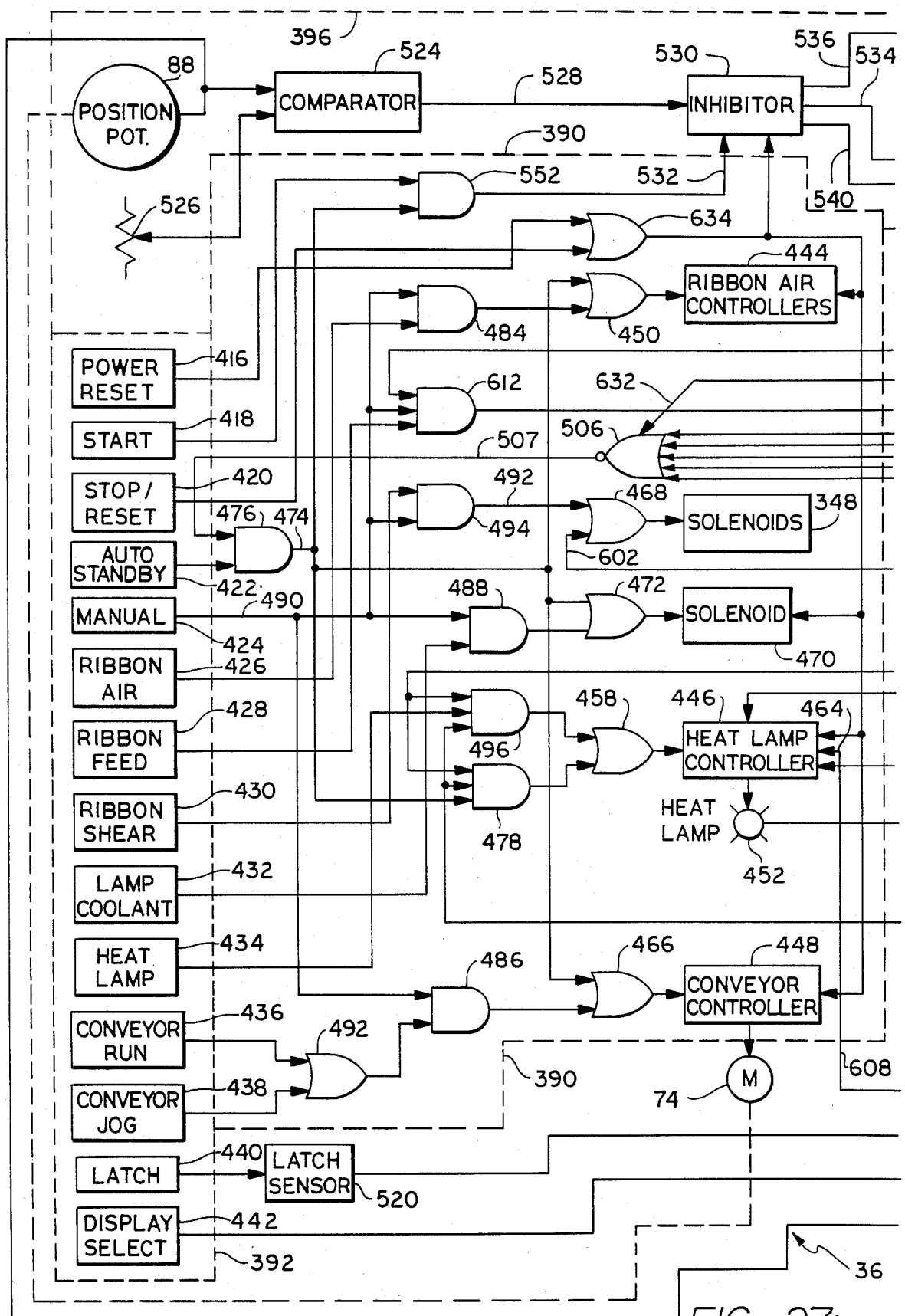
FIGS. 27A, 27B, and 27C (hereinafter sometimes referred to collectively as "FIG. 27") is a logic diagram corresponding generally to FIG. 26 and illustrating a preferred embodiment of the control circuitry of the machine of the present invention.
Figure 27B:
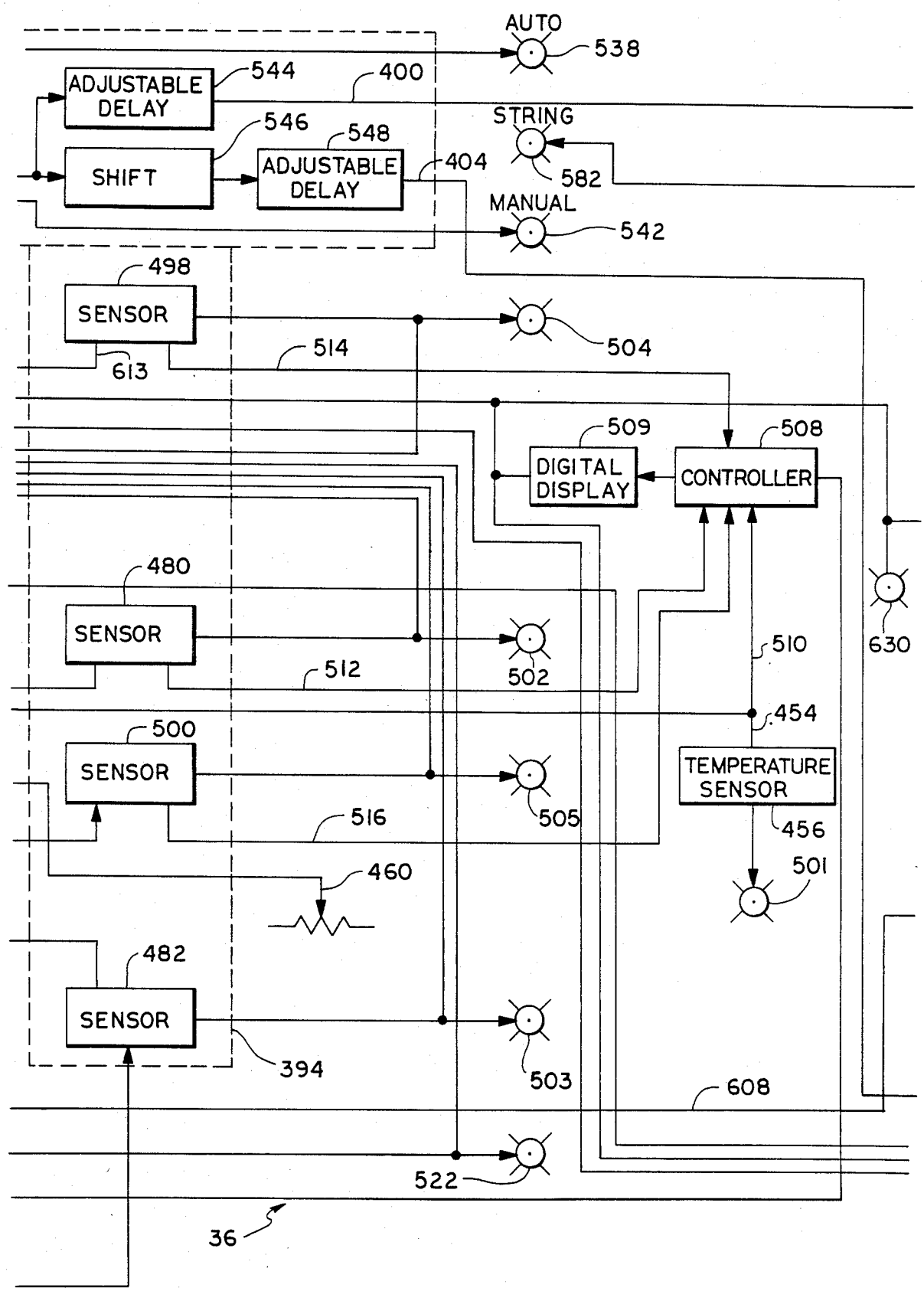
Figure 27C:
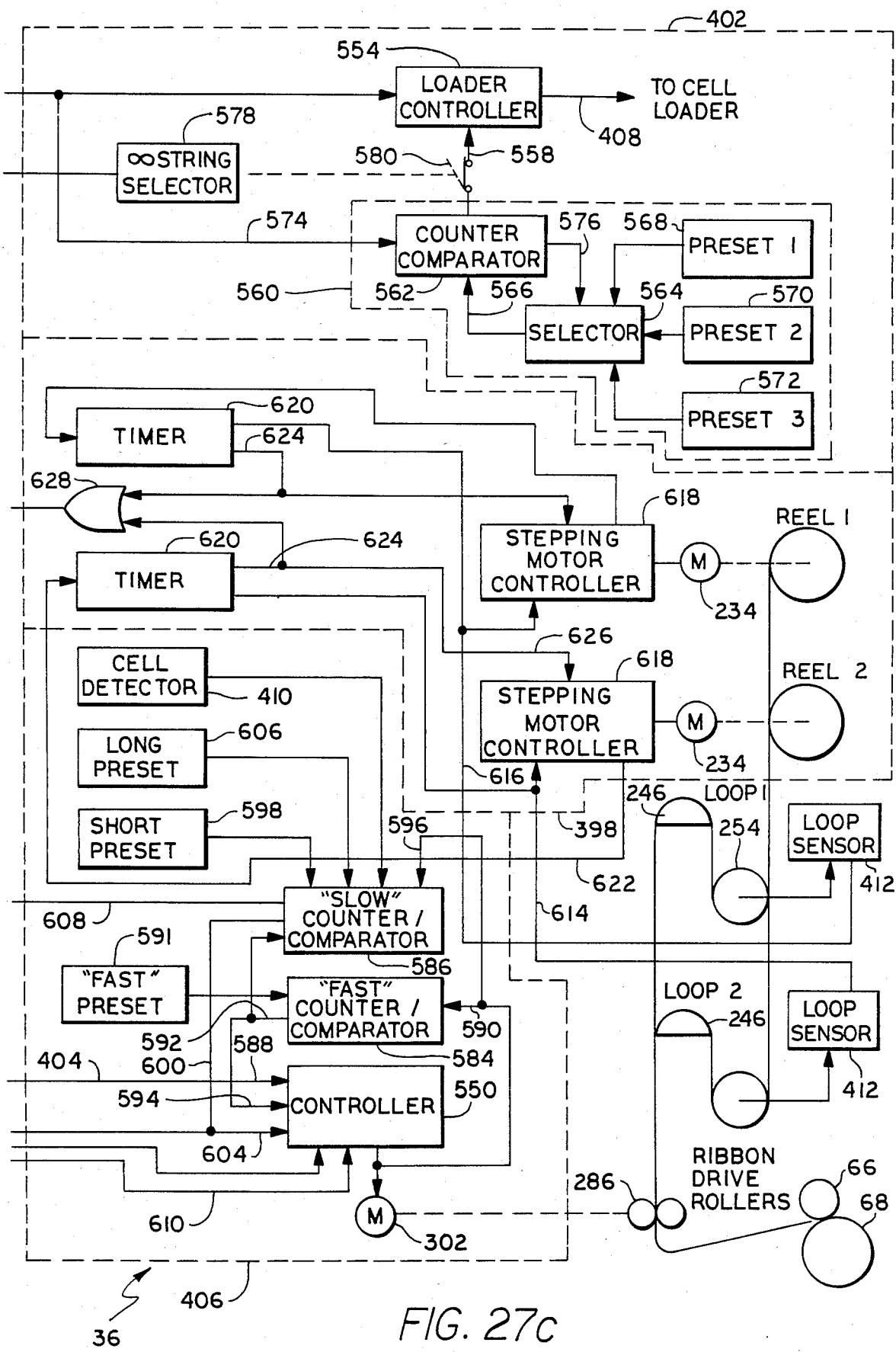

When the ribbon feed stepping motor 302 is driven by the controller 550, the ribbon drive rollers 286 (FIGS. 21 and 27C) draw ribbon from the service loop subassemblies 246 (FIGS. 19 and 27C). This initially raises the wheels 254 of the subassemblies and causes the loop sensors 412 to apply a triggering signal to the ribbon unwind control 398. The triggering signals from the two loop sensors are independent and pass along lines 614 and 616, respectively. Each of the signals is applied to a corresponding stepping motor controller 618 and a timer 620 of the unwind control. Each stepping motor controller applies a constant voltage to one of the ribbon reel stepping motors 234 to unwind one of the ribbon reels at a constant rate. The voltage is maintained until the corresponding service loop wheel 254 returns to its original condition. The signal from the loop sensor 412 is then terminated and the motor controller 618 stops driving the motor and passes a reset signal to the timer along a line 622. If, however, one of the loop sensors fails to turn off its motor controller and the corresponding timer reaches a preselected maximum time before being reset, a "time out" signal is passed from an output 624 of the timer to an inhibiting input 626 of the motor controller. The ribbon unwind control 398 is thus prevented from unwinding an excess amount of ribbon in the case of a machine malfunction. The "time out" signal from either timer also passes through an OR gate 628 to a "ribbon time out" LED 630 and an additional input 632 of the general alarm NOR gate 506. This causes the machine to drop out of the automatic mode and signals the operator that a malfunction has occurred in the ribbon unwind control.

In operation, the solder machine 30 can be operated in either the "manual" or "automatic" mode. Upon switching "on" the power, the "power reset" flip-flop 416 acts through an OR gate 634 to apply a reset signal to the inhibitor 530, the ribbon air controller 444, the lamp coolant solenoid 470, the heat lamp controller 446 and the conveyor controller 448. Each of these elements is reset to the "off" condition, with the following results: main timing is inhibited; ribbon air is shut down and LED 504 is "on"; lamp coolant is shut "off" and coolant LED 502 is "on"; heat lamp 452 is "off" and heat lamp LED 504 is "on"; conveyor drive is "off" and conveyor LED 503 is "on"; and manual LED 542 is "on".

Manual operation is possible only when the manual LED 542 is "on". As noted above regarding the manual mode, ribbon air must be activated before ribbon can be fed manually, and the heat lamp cannot be activated unless coolant is flowing and the conveyor is moving. Each of these functions can be turned on by pressing the control panel touch switches corresponding to the appropriate flip-flops.

The "automatic" mode can be entered by touching the auto/standby touch switch 422. If no general alarm is present, the output of the NOR gate 506 along the line 507 will be high, providing a high output along the line 474 to AND gates 552 and 478, and OR gates 450, 472 and 466. The ribbon air controller 444 will thus be activated to provide ribbon air to the ribbon drive mechanism 212 (FIGS. 20 and 21) and, if the sensor 498 detects sufficient air pressure, the ribbon air LED 504 will go out. The lamp coolant solenoid 470 and the conveyor controller 448 will likewise be energized, permitting coolant to flow and the conveyor to move. The respective LED's will go out if the functions come on in the desired manner. The AND gate 478 provides an enabling input to the OR gate 458 and the heat lamp controller 446 if the conveyor is "on" and lamp coolant is flowing. The closed feedback loop involving the cell temperature sensor 456 is placed in operation at this time to control the heat lamp, and manual operation of ribbon air, lamp coolant and the conveyor is inhibited. Manual operation of ribbon feed may also be inhibited at this time by additional circuitry (not shown) for locking the ribbon feed flip-flop 428 out of the manual mode. If each of the functions comes "on", and if the latch is latched and the ribbon reels are able to drive, the solder machine will enter the automatic mode. The manual LED 542 will then be turned "off" and the auto LED 538 will come "on". This condition is a form of "standby", in which the machine is ready to be placed in the automatic mode of operation. If any of the functions do not come "on", or if the upper assembly is unlatched or the ribbon reels cannot drive, the machine will revert to the manual mode and will leave "on" all the functions that came "on" when the auto/standby touch switch 422 was depressed. The alarm LED's of the control panel 392 will then signify which functions did not come "on". The operating functions stay "on" at this time because the elements 416 through 434 are flip-flops which stay in the automatic mode until they are reset.

Automatic operation of the solder machine is commenced by depressing the "start" flip-flop 418 after the auto/standby mode has been achieved. This produces a "start" signal along the control input 532 of the inhibitor 530, permitting the main timing signals to pass to the cell loader control circuit 402 and the ribbon drive control 406. The cell loader control circuit then begins loading one cell for each timing signal along the line 400, with the exception of cells skipped in a preselected sequence determined by the presettable counter 560.

The ribbon drive control 406 is activated through a complete ribbon drive sequence for each delayed timing signal passed along the line 404. The signals are delayed for a period equal to three cell lengths to account for the distance between the cell loading position and the ribbon feed location. Ribbon is thus fed behind and under the first cell in the series at a very fast rate and subsequently fed onto the top of the succeeding cell at the rate of movement of the main conveyor. If there is no gap between the cells, the fast sequence of pulses to the ribbon feed motor 302 is followed by a short count of slow pulses sufficient to pay out enough ribbon to reach substantially to the trailing edge of the succeeding cell. If, however, a gap is present between cells because loading of a cell was inhibited by the presettable counter 560, the slow series of pulses is lengthened to extend across the gap and over the length of the succeeding cell. In either case, the ribbon is sheared at the end of the short count and the ribbon feed motor is shut off. Shortly thereafter another delayed timing signal is received by the controller 550, triggering another ribbon drive sequence.

As the cells pass from the ribbon feed location to the solder rollers 66 and 68, they are heated by the lamp 452 and the closed loop feedback system of the sensor 456 and the controller 446 (collectively referred to above as the heater assembly 220 of FIGS. 17 and 18). The system 220 senses the temperature of the cell and varies the voltage to the lamp to minimize the difference between the sensed temperature and a preselected soldering temperature.

During the entire operation, the conveyors 46 and 48 (FIGS. 1 through 3) maintain the cells in alignment to permit accurate positioning of the conductive ribbons on the cells. As seen in FIGS. 4A and 4B, the ribbons must be placed on the solder pads of the cells in a highly accurate manner so that they contact and are soldered to a required number of pads. Otherwise, the cells can be partially or totally inoperative. The solder pads on the front or "active" side of the cells may be arranged in two rows, of eleven pads each, the end pads being rectangular in shape and having a side-to-side dimension of approximately 0.15 inch (3.8 mm) and a front-to-back dimension of approximately 0.075 inch (1.9 mm). The nine intermediate pads are preferably square in shape and 0.075 inch (1.9 mm) and on a side. A 50 mil (1.3 mm) wide copper conductive ribbon can be used to connect the pads in the manner shown in FIG. 4A. The ribbons are preferably coated with solder and possibly flux to produce a good solder joint when pressed against the solar cells at elevated temperatures. The pads themselves are formed of a thick film metallization approximately 0.015 mm thick.

In the context of the above solder pad arrangement, satisfactory connection between cells has been found to require that each ribbon completely overlie each of the end pads and overlie at least four of the nine intermediate pads. Otherwise, the cell might not give full output power or perform reliably. While specifications of this type have been extremely difficult to satisfy with the prior solder machines known to applicant, they are readily obtainable with the automatic solder machine 30 described herein.

The solder machine 30 can be stopped by depressing the stop/reset touch switch 420 of the control panel 392, which terminates and resets all of the functions.

With regard to FIG. 28, the control panel 392 may be provided with additional alarm LED's, if desired. For example, an LED 636 may be provided to indicate a malfunction of the loader control circuit 402. In that case, sensing circuitry of conventional design may be added to the circuit 402. A "power" LED 638 may also be provided to indicate when the power is turned on. With regard to the LED's 518 associated with the digital display 509, the conditions listed beside the LED's are merely examples of conditions for which a digital display can be provided. The listings "ribbon air pressure, PSIG" and "lamp coolant pressure, PSIG" denote the amount by which the air and coolant pressure, respectively, differ from a preselected optimum value.

The touch switches of the control panel 392 correspond primarily to the flip-flops 416 through 442 of FIG. 27A and have been numbered accordingly. However, three of the touch switches are not shown in FIG. 27 and correspond to optional features of the machine 30. Specifically, the "test" touch switch 640 is not connected to a flip-flop but rather is designed to start the apparatus momentarily when it is in the auto/standby mode. A "cooling air" touch switch 642 is provided to manually and separately provide cooling air to the nozzles 242, if desired, and a "cell loader" touch switch is provide to manually energize the cell loader 37 and cause it to load a cell onto the conveyor.

From the above, it can be seen that there has been provided a compact and reliable machine capable of automatically connecting a plurality of solar cells together by segments of conductive ribbon which are accurately aligned with and soldered to conductive pads on the cells.

While a specific embodiment of the present invention has been disclosed as typical, the invention is of course not limited to this particular form, but rather is applicable broadly to all such variations as fall within the scope of the appended claims.

What is claimed is:

1. Apparatus for applying at least one elongated conductor to a plurality of solar cells having first and second oppositely directed surface portions to establish electrical connection between the cells, comprising:
primary means for concurrently conveying the cells toward a preselected location at a first rate of speed and in a first spaced apart condition;
secondary means for conveying the cells from the preselected location at a second reduced rate of speed and in a second more closely spaced condition;
means for feeding at least one elongated conductor between each cell and a succeeding cell as they are conveyed from the preselected location, such that the conductor extends from the first surface portion of said cell to the second surface portion of the succeeding cell; and
means for soldering the conductor to said first and second surface portions at a second loaction downstream of said preselected location.

2. The apparatus recited in claim 1 wherein the primary and secondary conveying means are constructed and arranged to continuously convey the cells past the preselected location.

3. The apparatus recited in claim 2 wherein the primary and secondary conveying means are substantially aligned with each other and have primary and secondary pusher elements, respectively, the primary conveying means overlapping the secondary conveying means substantially at the preselected location.

4. The apparatus recited in claim 3 wherein the soldering means comprises heating means and means for pressing the conductor against the oppositely directed surface portions of the solar cells in a soldering relationship as the cells are moved by the secondary conveying means.

5. The apparatus recited in claim 3 wherein the secondary conveying means includes a pair of spaced substantially horizontal rails for supporting the solar cells in a sliding relationship, and the secondary pusher elements are positioned between the rails.

6. Apparatus for applying at least one elongated conductor to a plurality of solar cells to establish electrical connection between the cells, comprising:
means for conveying the cells past a preselected location;
means for feeding at least one elongated conductor between each cell and the succeeding cell as they are conveyed past the preselected location;
means for soldering the elongated conductor to said cells at a second location downstream of the preselected location; and
means for synchronizing the feeding means with the conveying means, comprising means for generating a continuously varying analog signal representing the position of the cell along the conveying means and means for controlling the feeding means in response to the analog signal.

7. The apparatus recited in claim 6 wherein the controlling means includes means for comparing the analog signal to at least one signal which represents a particular position of the cell, and generating a control signal when the analog signal satisfies a preselected relationship relative to the reference signal.

8. Apparatus for applying at least one elongated conductor to a plurality of solar cells having first and second oppositely directed surface portions to establish electrical connection between the cells, comprising:
primary means for conveying the cells to a preselected location at a first rate of speed and in a first spaced apart condition;
secondary means for conveying the cells from the preselected location at a second reduced rate of speed and in a second more closely spaced condition;
means for feeding at least one elongated conductor between each cell and a succeeding cell as they are conveyed past the preselected location, such that the conductor extends from the first surface portion of said cell to the second surface portion of the succeeding cell;
soldering means at a second location downstream of the preselected location comprising heating means and means for pressing the elongated conductor against said first and second surface portions in a soldering relationship; and
means for synchronizing the feeding means and soldering means with the conveying means, comprising potentiometer means coupled to the conveying means for generating a continuously varying analog signal representing the position of a cell along the conveying means and means for controlling the feeding means and the soldering means in response to the analog signal.

9. A method of applying at least one elongated conductor to a plurality of solar cells having first and second oppositely directed surface portions to establish electrical connection between the cells, comprising:
conveying the cells concurrently toward a preselected location at a first rate of speed and in a first spaced apart condition;

conveying the cells from the preselected location at a second reduced rate of speed and in a second more closely spaced condition;

feeding at least one elongated conductor between each cell and the succeeding cell as the cells are conveyed from the preselected location, such that the conductor extends from the first surface portion of one cell to the second surface portion of the succeeding cell; and soldering the conductor to said first and second surface portions at a second location downstream of the preselected location.

10. The method recited in claim 9 wherein the cells are continuously conveyed past the preselected location.

11. A method of applying at least one elongated conductor to a plurality of solar cells to establish electrical connection between the cells, comprising:

conveying the cells past a preselected location;

feeding at least one elongated conductor between each cell and the succeeding cell as they are conveyed past the preselected location;

soldering the elongated conductor to said cells at a second location downstream of the preselected location; and synchronizing the feeding step with the conveying of the cells by generating a continuously varying analog signal representing the position of a cell relative to the preselected location and controlling the feeding step in response to the analog signal.

12. The method recited in claim 11 wherein the soldering operation is also controlled in response to the analog signal.

13. The method recited in claim 12 wherein the analog signal is compared to at least one reference signal representing a desired position of the cell, and a control signal is generated when the analog signal satisfies a preselected relationship relative to the reference signal.

14. Apparatus for applying at least one elongated conductor to a plurality of solar cells having first and second oppositely directed surface portions to establish electrical connection between the cells, comprising:

primary means for conveying the cells toward a preselected location at a first rate of speed and in a first spaced apart condition;

secondary means for conveying the cells from the preselected location at a second reduced rate of speed and in a second more closely spaced condition;

the primary and secondary conveying means having primary and secondary pusher elements, respectively, and the secondary conveying means overlapping the primary conveying means to continuously convey the cells past the preselected location;

means for feeding at least one elongated conductor between each cell and a succeeding cell as they are conveyed past the preselected location, such that the conductor extends from the first surface portion of said cell to the second surface portion of the succeeding cell; and means for soldering the conductor to said first and second surface portions at a second location downstream of said preselected location, the soldering means comprising:

means for heating the conductor and the surface portions of the solar cells; and means for pressing the conductor against the surface portions of the solar cells in a soldering relationship as the cells are moved by the secondary conveying means, the pressing means comprising pincher rollers and means for driving the rollers at a circumferential speed slightly greater than the second reduced rate of speed of the secondary conveying means.

15. Apparatus for applying at least one elongated conductor to a plurality of solar cells having first and second surface portions and a pair of edge portions at opposite sides of said surface portions, to establish electrical connection between the cells, comprising:

primary means for conveying the cells toward a preselected location at a first rate of speed and in a first spaced apart condition;

secondary means for conveying the cells from the preselected location at a second reduced rate of speed and in a second more closely spaced condition, including a pair of spaced substantially horizontal rails for supporting the solar cells in a sliding relationship;

the primary and secondary conveying means having primary and secondary pusher elements, respectively, with the secondary pusher elements being positioned between the rails and the secondary conveying means overlapping the primary conveying means to continuously convey the cells past the preselected location;

the secondary conveying means also including means for momentarily applying a drag force to the edge portions of the cells to urge the cells against the pusher elements;

means for feeding at least one elongated conductor between each cell and a succeeding cell as they are conveyed past the preselected location, such that the conductor extends from the first surface portion of said cell to the second surface portion of the succeeding cell; and means for soldering the conductor to said first and second surface portions at a second location downstream of said preselected location.

16. Apparatus for applying at least one elongated conductor to a plurality of solar cells having first and second oppositely directed surface portions to establish electrical connection between the cells, comprising:

primary means for conveying the cells toward a preselected location at a first rate of speed and in a first spaced apart condition;

secondary means for conveying the cells from the preselected location at a second reduced rate of speed and in a second more closely spaced condition;

the primary and secondary conveying means being constructed and arranged to convey the cells past the preselected location;

means for feeding at least one elongated conductor between each cell and a succeeding cell at an initial feed rate greater than said second rate of speed as the cells are conveyed past the preselected location so as to position a leading end portion of the conductor against the first surface portion of said cell, thereafter feeding the conductor against the second surface portion of the succeeding cell at substantially said second rate of speed, and finally severing the conductor after it is fed at the second rate of speed, such that the conductor extends from the first surface portion of said cell to the second surface portion of the succeeding cell; and means for soldering the conductor to said first and second surface portions at a second location downstream of said preselected location.

17. Apparatus for applying at least one elongated conductor to a plurality of solar cells having first and second oppositely directed surface portions to establish electrical connection between the cells, comprising:

primary means for conveying the cells toward a preselected location at a first rate of speed and in a first spaced apart condition;

secondary means for conveying the cells from the preselected location at a second reduced rate of speed and in a second more closely spaced condition;

means for feeding at least one elongated conductor between each cell and a succeeding cell as they are conveyed past the preselected location, such that the conductor extends from the first surface portion of said cell to the second surface portion of the succeeding cell; and means for soldering the conductor to said first and second surface portions at a second location downstream of said preselected location, the soldering means comprising:
means for heating the conductor and the surface portions of the solar cells; and
means for pressing the conductor against the surface portions of the solar cells in a soldering relationship as the cells are moved by the secondary conveying means, the pressing means comprising pincher rollers and means for driving the rollers at a circumferential speed slightly greater than the second reduced rate of speed of the secondary conveying means.

18. Apparatus for applying at least one elongated conductor to a plurality of solar cells having first and second surface portions and a pair of edge portions at opposite sides of said surface portions, to establish electrical connection between the cells, comprising:

primary means for conveying the cells toward a preselected location at a first rate of speed and in a first spaced apart condition;

secondary means for conveying the cells from the preselected location at a second reduced rate of speed and in a second more closely spaced condition, including a pair of spaced substantially horizontal rails for supporting the solar cells in a sliding relationship;

the secondary conveying means including pusher elements positioned between the rails and means for momentarily applying a drag force to the edge portions of the cells to urge the cells against the pusher elements;

means for feeding at least one elongated conductor between each cell and a succeeding cell as they are conveyed past the preselected location, such that the conductor extends from the first surface portion of said cell to the second surface portion of the succeeding cell; and means for soldering the conductor to said first and second surface portions at a second location downstream of said preselected location.

19. A method of applying at least one elongated conductor to a plurality of solar cells having first and second oppositely directed surface portions to establish electrical connection between the cells, comprising:

conveying the cells to a preselected location at a first rate of speed and in a first spaced apart condition;

conveying the cells from the preselected location at a second reduced rate of speed and in a second more closely spaced condition;

feeding at least one elongated conductor between each cell and the succeeding cell as the cells are conveyed past the preselected location, such that the conductor extends from the first surface portion of one cell to the second surface portion of the succeeding cell; and soldering the conductor to said first and second surface portions at a second location downstream of the preselected location, the soldering step comprising:
heating the elongated conductor and the cells at a second location downstream of the preselected location; and
pressing the conductor against the surface portions of the cells in a soldering relationship;
the conductor and the cells being drawn forwardly during the pressing operation at a rate slightly greater than the rate at which the cells are conveyed.

20. A method of applying at least one elongated conductor to a plurality of solar cells having first and second oppositely directed surface portions to establish electrical connection between the cells, comprising:

conveying the cells to a preselected location at a first rate of speed and in a first spaced apart condition;

conveying the cells from the preselected location at a second reduced rate of speed and in a second more closely spaced condition;

feeding at least one elongated conductor between each cell and the succeeding cell at an initial feed rate greater than said second rate of speed as the cells are conveyed past the preselected location so as to position a leading end portion of the conductor against the first surface portion of the cell, subsequently feeding the conductor against the second surface portion of the succeeding cell at substantially the second rate of speed, and shearing the conductor to produce a discrete segment having a trailing end portion adjacent to said second surface portion, such that the conductor extends from the first surface portion of one cell to the second surface portion of the succeeding cell; and soldering the conductor to said first and second surface portions at a second location downstream of the preselected location.

21. A method of applying at least one elongated conductor to a plurality of solar cells having first and second oppositely directed surface portions to establish electrical connection between the cells, comprising:

conveying the cells concurrently toward a preselected location at a first rate of speed and in a first spaced apart condition;

conveying the cells from the preselected location at a second reduced rate of speed and in a second more closely spaced condition;

feeding at least one elongated conductor between each cell and the succeeding cell as the cells are conveyed from the preselected location, such that the conductor extends from the first surface portion of one cell to the second surface portion of the succeeding cell;

soldering the conductor to said first and second surface portions at a second location downstream of the preselected location; and synchronizing the feeding step and the soldering step with the cell conveyance means by generating a continuously varying analog signal representing the position of a cell and controlling a feeding means and a soldering means in response to the analog signal.

22. The apparatus recited in claim 16 which further comprises means for unwinding the conductor from a continuous length of conductive material to supply the feeding means, the unwinding means including means for providing a service loop of the conductive material between the continuous length and the feeding means.

* * * * *